US011605428B2

(12) United States Patent
Cho et al.

(10) Patent No.: US 11,605,428 B2
(45) Date of Patent: Mar. 14, 2023

(54) VERTICAL NONVOLATILE MEMORY DEVICE INCLUDING MEMORY CELL STRING

(71) Applicant: Samsung Electronics Co., Ltd., Suwon-si (KR)

(72) Inventors: Youngjin Cho, Suwon-si (KR); Jungho Yoon, Yongin-si (KR); Seyun Kim, Seoul (KR); Jinhong Kim, Seoul (KR); Soichiro Mizusaki, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 131 days.

(21) Appl. No.: 17/146,999

(22) Filed: Jan. 12, 2021

(65) Prior Publication Data

US 2021/0217473 A1     Jul. 15, 2021

(30) Foreign Application Priority Data

Jan. 14, 2020   (KR) .......................... 10-2020-0004948

(51) Int. Cl.
    *G11C 11/00*         (2006.01)
    *G11C 13/00*         (2006.01)
    (Continued)

(52) U.S. Cl.
    CPC .......... *G11C 13/0069* (2013.01); *G06N 3/04* (2013.01); *G11C 13/004* (2013.01); *H01L 27/2454* (2013.01); *H01L 45/146* (2013.01)

(58) Field of Classification Search
    CPC ............. G11C 13/0069; G11C 13/004; G11C 2213/71; G11C 2213/75; G11C 13/0007;
    (Continued)

(56) References Cited

U.S. PATENT DOCUMENTS 8,247,788 B2    8/2012   Seol et al.
8,450,713 B2    5/2013   Awaya et al.
               (Continued)

FOREIGN PATENT DOCUMENTS

EP         3772062 A1    2/2021
KR     100976424 B1    8/2010
             (Continued)

OTHER PUBLICATIONS

Yu-Hsien Lin et al. "2-bit poly-Si-TFT nonvolatile memory using hafnium oxide, hafnium silicate and zirconium silicate", 2005 IEDM Technical Digest, pp. 1-4.
(Continued)

*Primary Examiner* — Hien N Nguyen
(74) *Attorney, Agent, or Firm* — Harness, Dickey & Pierce, P.L.C.

(57) ABSTRACT

A vertical nonvolatile memory device including a memory cell string using a resistance change material is disclosed. Each memory cell string of the nonvolatile memory device includes a semiconductor layer extending in a first direction and having a first surface opposite a second surface, a plurality of gates and a plurality of insulators alternately arranged in the first direction and extending in a second direction perpendicular to the first direction, a gate insulating layer extending in the first direction between the plurality of gates and the semiconductor layer and between the plurality of insulators and the semiconductor layer, and a dielectric film extending in the first direction on the surface of the semiconductor layer and having a plurality of movable oxygen vacancies distributed therein.

32 Claims, 20 Drawing Sheets

(51) Int. Cl.
*G06N 3/04* (2023.01)
*H01L 27/24* (2006.01)
*H01L 45/00* (2006.01)

(58) Field of Classification Search
CPC ...... G11C 16/0483; G11C 16/24; G06N 3/04; H01L 27/2454; H01L 45/146; H01L 45/08; H01L 45/124; H01L 27/2481; H01L 27/1157; H01L 27/11582; H01L 27/11568; H01L 29/66833; H01L 29/792
See application file for complete search history.

(56) References Cited

U.S. PATENT DOCUMENTS

| | | | |
|---|---|---|---|
| 9,093,369 B2 | 7/2015 | Shin et al. | |
| 9,691,756 B2 | 6/2017 | Kwon | |
| 2011/0199813 A1* | 8/2011 | Yoo | G11C 14/00 |
| | | | 438/634 |
| 2012/0211718 A1 | 8/2012 | Shima et al. | |
| 2012/0280298 A1* | 11/2012 | Park | H01L 27/11582 |
| | | | 257/314 |
| 2013/0328005 A1 | 12/2013 | Shin et al. | |
| 2014/0145137 A1 | 5/2014 | Ju et al. | |
| 2016/0126455 A1* | 5/2016 | Hayashi | H01L 45/1273 |
| | | | 257/2 |
| 2016/0300885 A1* | 10/2016 | Konevecki | H01L 27/249 |

FOREIGN PATENT DOCUMENTS

| | | |
|---|---|---|
| KR | 101144440 B1 | 5/2012 |
| KR | 101497547 B1 | 3/2015 |

OTHER PUBLICATIONS

M. Kinoshita et al. "Scalable 3-D vertical chain-cell-type phase-change memory with 4F2 poly-Si diodes", 2012 Symposium on VLSI Technology Digest of Technical Papers, pp. 35-36.

Extended European Search Report dated Jun. 2, 2021, issued in corresponding European Patent Application No. 21151132.4.

* cited by examiner

VERTICAL NONVOLATILE MEMORY DEVICE INCLUDING MEMORY CELL STRING

CROSS-REFERENCE TO RELATED APPLICATION

This application claims the benefit of Korean Patent Application No. 10-2020-0004948, filed on Jan. 14, 2020, in the Korean Intellectual Property Office, the disclosure of which is incorporated herein in its entirety by reference.

BACKGROUND

1. Field

Inventive concepts relate to a vertical non-volatile memory device including a memory cell string.

2. Description of Related Art

A nonvolatile memory device serving as a semiconductor memory device includes a plurality of memory cells that may store information even when a power supply is disconnected and may use the stored information again when power is supplied. As an example of a nonvolatile memory device, the nonvolatile memory device may be used in a mobile phone, a digital camera, a personal digital assistant (PDA), a mobile computer device, a fixed computer device, and other devices.

Recently, research has been conducted on using a three-dimensional (or vertical) NAND (VNAND) in a chip forming a next-generation neuromorphic computing platform or a neural network. In particular, there is a need for a technology having high-density and low-power characteristics and enabling random access to memory cells.

SUMMARY

Provided is a vertical nonvolatile memory device including a memory cell string using a resistance change material.

Particularly, provided is a vertical nonvolatile memory device that includes a dielectric film including a mixture of a material of a semiconductor layer and a material of a resistance change layer between the semiconductor layer and the resistance change layer in a memory cell string.

Additional aspects will be set forth in part in the description which follows and, in part, will be apparent from the description, or may be learned by practice of the presented embodiments of the disclosure.

According to an embodiment, a nonvolatile memory device includes a plurality of memory cell strings. Each of the plurality of memory cell strings includes a semiconductor layer extending in a first direction and having a first surface opposite a second surface; a plurality of gates and a plurality of insulators extending in a second direction perpendicular to the first direction, the plurality of gates and the plurality of insulators being alternately arranged in the first direction; a gate insulating layer extending in the first direction between the plurality of gates and the first surface of the semiconductor layer and between the plurality of insulators and the first surface of the semiconductor layer; and a dielectric film extending in the first direction on the second surface of the semiconductor layer, the dielectric film having a plurality of movable oxygen vacancies distributed therein.

In some embodiments, the dielectric film may include a mixture of a material of the semiconductor layer and a transition metal oxide.

For example, in some embodiments, the material of the semiconductor layer may include at least one of Si, Ge, indium gallium zinc oxide (IGZO), and GaAs.

In addition, in some embodiments, the transition metal oxide may include an oxide of at least one of, for example, zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), and praseodymium (Pr).

As one example, in some embodiments, a proportion of the material of the semiconductor layer in the dielectric film may be, for example, about 20 at. % to about 80 at. %.

As another example, in some embodiments, the proportion of the material of the semiconductor layer in the dielectric film may be, for example, about 40 at. % to about 60 at. %.

In some embodiments, the proportion of the material of the semiconductor layer in the dielectric film may be constant within a deviation range of, for example, about 10% in an entire region of the dielectric film.

In addition, in some embodiments, a width of the dielectric film in the second direction may be, for example, about 1.5 nm to about 10 nm.

In some embodiments, the width of the dielectric film may be constant within a deviation range of, for example, about 10% in an entire region of the dielectric film.

In some embodiments, the dielectric film may include a plurality of first layers and plurality of second layers. The plurality of first layers may be formed of a material of the semiconductor layer and the plurality of second layers may be formed of a transition metal oxide. The plurality of first layers and the plurality of second layers may be alternately arranged in the first direction.

For example, in some embodiments, the plurality of first layers and the plurality of second layers may be formed by an atomic layer deposition method or a chemical vapor deposition method.

In some embodiments, the thickness of each of the first layers and a thickness of each of the second layers may be, for example, about 0.1 nm to about 1 nm.

As one example, in some embodiments, a ratio of the thickness of each of the first layers to a sum of the thicknesses of each of the first layers and each of the second layers may be, for example, about 20% to about 80%.

As another example, in some embodiments, the ratio of the thickness of each of the first layers to a sum of the thicknesses of each of the first layers and each of the second layers may be, for example, about 40% to about 60%.

In some embodiments, a ratio of the thickness of each of the first layers to a sum of the thicknesses of each the first layers and each of the second layers may be constant within a deviation range of, for example, about 10% in an entire region of the dielectric film.

In some embodiments, each of the plurality of memory cell strings may further include a resistance change layer facing the second surface of the semiconductor layer and extending in the first direction, and the dielectric film may be between the second surface of the semiconductor layer and the resistance change layer.

In some embodiments, the dielectric film may include a mixture of a material of the semiconductor layer and a material of the resistance change layer.

In this case, each corresponding memory cell string of the plurality of memory cell strings may include a plurality of memory cells arranged in a vertical stacked structure of the corresponding memory cell string. Each corresponding memory cell of the plurality of memory cells in the corresponding memory cell string may be defined by a corresponding gate among the plurality of gates in the corresponding memory cell, a part of the semiconductor layer of the corresponding memory cell string adjacent to the corresponding gate in the second direction, a part of the gate insulating layer of the corresponding memory cell string adjacent to the corresponding gate in the second direction, a part of the dielectric film of the corresponding memory cell string adjacent to the corresponding gate in the second direction, and a part of the resistance change layer of the corresponding memory cell string adjacent to the corresponding gate in the second direction.

In some embodiments, the nonvolatile memory device may further include a control logic and a bit line. The control logic may be configured to control voltages applied to at least one the plurality of memory cell strings such that, during a read mode, the control logic may be configured to apply a first voltage to an unselected memory cell and a second voltage to a selected memory cell. The first voltage may cause a current to flow only through the semiconductor layer of the unselected memory cell. The second voltage may cause current to flow through all of the semiconductor layer, the dielectric film, and the resistance change layer of the selected memory cell. The bit line may be configured to apply a read voltage to the selected memory cell. The unselected memory cell and the selected memory cell may be among the plurality of memory cells in the plurality of memory cell strings. The selected memory cell may be in a selected memory cell string among the plurality of memory cell strings.

In some embodiments, an absolute value of the second voltage may be less than an absolute value of the first voltage.

In some embodiments, the second voltage may have a value that causes a resistance of the semiconductor layer of the selected memory cell to be greater than or equal to a minimum resistance of a combined resistance of a resistance of the dielectric film and a resistance of the resistance change layer of the selected memory cell.

In addition, in some embodiments, the second voltage may have a value that causes a resistance of the semiconductor layer of the selected memory cell to be less than or equal to a maximum resistance of a combined resistance of a resistance of the dielectric film and a resistance of the resistance change layer of the selected memory cell.

In some embodiments, an absolute value of the second voltage may be greater than an absolute value of a third voltage, and the control logic may be configured to apply the third voltage to the selected memory cell for causing a current to flow through only the dielectric film and the resistance change layer of the selected memory cell in the selected memory cell string.

In some embodiments, the control logic may be configured to control voltages applied to at least one of the plurality of memory cell strings in a program mode. The control logic may be configured to apply the first voltage to the unselected memory cell and the third voltage to the selected memory cell during the program mode. The bit line may be configured to apply a positive program voltage to the selected memory cell during the program mode.

The dielectric film is configured such that, in response to the positive program voltage being applied to the selected memory cell through the bit line, the oxygen vacancies may move toward an interface between the semiconductor layer of the selected memory cell string and the dielectric film of the selective memory cell string in a partial region of the dielectric film corresponding to the selected memory cell, a density of the oxygen vacancies may increase at the interface between the semiconductor layer of the selected memory cell string and the dielectric film of the selected memory cell string, and a resistance of the partial region of the dielectric film of the selected memory cell string may be reduced.

In addition, in some embodiments, the dielectric film may be configured to have at least four different resistance states.

In some embodiments, the dielectric film may be configured to change a resistance state thereof based on a phenomenon in which electrons may be trapped and detrapped in traps formed by oxygen vacancies.

In some embodiments, the control logic may be configured to control voltages applied to at least one of plurality of memory cell strings in an erase mode. The control logic may be configured to apply the first voltage to the unselected memory cell and the third voltage to the selected memory cell during the erase mode. The bit line may be configured to apply a negative erase voltage to the selected memory cell during the erase mode.

In some embodiments, the dielectric film may be configured such that, in response to the negative erase voltage being applied to the selected memory cell through the bit line, the oxygen vacancies move in a direction away from an interface between the semiconductor layer of the selected memory cell string and the dielectric film of the selected memory cell string in a partial region of the dielectric film of the selected memory cell string corresponding to the selected memory cell, a density of the oxygen vacancies is reduced at the interface between the semiconductor layer of the selected memory cell string and the dielectric film of the selected memory cell string, and a resistance of the partial region of the dielectric film of the selected memory cell string increases.

According to an embodiment, a nonvolatile memory device includes a substrate; a plurality of gates and a plurality of insulators alternately stacked on each other on the substrate; a plurality of bit lines extending in a first direction crossing the plurality of gates extending in a second direction; and a plurality of memory cell strings spaced apart from each other on the substrate and extending vertically through the plurality of gates and the plurality of insulators. Each of the plurality of memory cell strings is connected to a corresponding bit line among the plurality of bit lines. Each of the plurality of memory cell strings includes a resistance change layer, a dielectric film surrounding the resistance change layer, a semiconductor layer surrounding the dielectric film, and a gate insulating layer surrounding the semiconductor layer. Each of the plurality of memory cell strings includes a plurality of memory cells stacked on top of each other. Each memory cell among the plurality of memory cells is defined by a corresponding gate, among the plurality of gates, connected respectively to a corresponding portion of the resistance change layer, a corresponding portion of the dielectric film, a corresponding portion of the semiconductor layer, and a corresponding portion of the gate insulating layer at a same height in a same one of the plurality of memory cell strings. Each memory cell is configured to have movable oxygen vacancies inside the corresponding portion of the dielectric film in response to voltages applied to the corresponding gate and the corresponding bit line connected to the memory cell.

In some embodiments, the nonvolatile memory device may further include a control logic coupled to the plurality of gates. The control logic may configured to read a selected memory cell by applying a first voltage to an unselected memory cell and a second voltage to the selected memory cell using two of the plurality of gates while a read voltage is applied to a selected memory cell string using the corresponding bit line connected to the selected memory cell string. The selected memory cell string may include the selected memory cell and the unselected memory cell among the plurality of memory cells in the selected memory cell string. The first voltage may cause a current to flow only through the corresponding portion of the semiconductor layer of the unselected memory cell. The second voltage may cause a current to flow through the corresponding portion of the semiconductor layer, the corresponding portion of the dielectric film, and the corresponding portion of the resistance change layer of the selected memory cell.

In some embodiments, the nonvolatile memory device may further include a control logic coupled to the plurality of gates. The control logic may be configured to program a selected memory cell by applying a first voltage to an unselected memory cell and a turn-off voltage to the selected memory cell using two of the plurality of gates while a positive program voltage is applied to a selected memory cell string using the corresponding bit line connected to the selected memory cell string. The selected memory cell string may include the selected memory cell and the unselected memory cell among the plurality of memory cells in the selected memory cell string. The first voltage may cause a current to flow only through the corresponding portion of the semiconductor layer of the unselected memory cell. The turn-off voltage may cause a current to flow through the corresponding portion of the dielectric film and the corresponding portion of the resistance change layer of the selected memory cell.

In some embodiments, the nonvolatile memory device may further include a control logic coupled to the plurality of gates. The control logic may be configured to erase a selected memory cell by applying a first voltage to an unselected memory cell and a turn-off voltage to the selected memory cell using two of the plurality of gates while a negative erase voltage is applied to a selected memory cell string using the corresponding bit line connected to the selected memory cell string. The selected memory cell string may include the selected memory cell and the unselected memory cell among the plurality of memory cells in the selected memory cell string. The first voltage may cause a current to flow only through the corresponding portion of the semiconductor layer of the unselected memory cell. The turn-off voltage may cause a current to flow through the corresponding portion of the dielectric film and the corresponding portion of the resistance change layer of the selected memory cell.

In some embodiments, the resistance change layer may include an oxide of at least one of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), and praseodymium (Pr). The semiconductor layer may include silicon, germanium, indium gallium zinc oxide (IGZO), or GaAs. The gate insulating layer may include silicon oxide. The dielectric film may include a mixture of a material of the semiconductor layer and a transition metal oxide.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
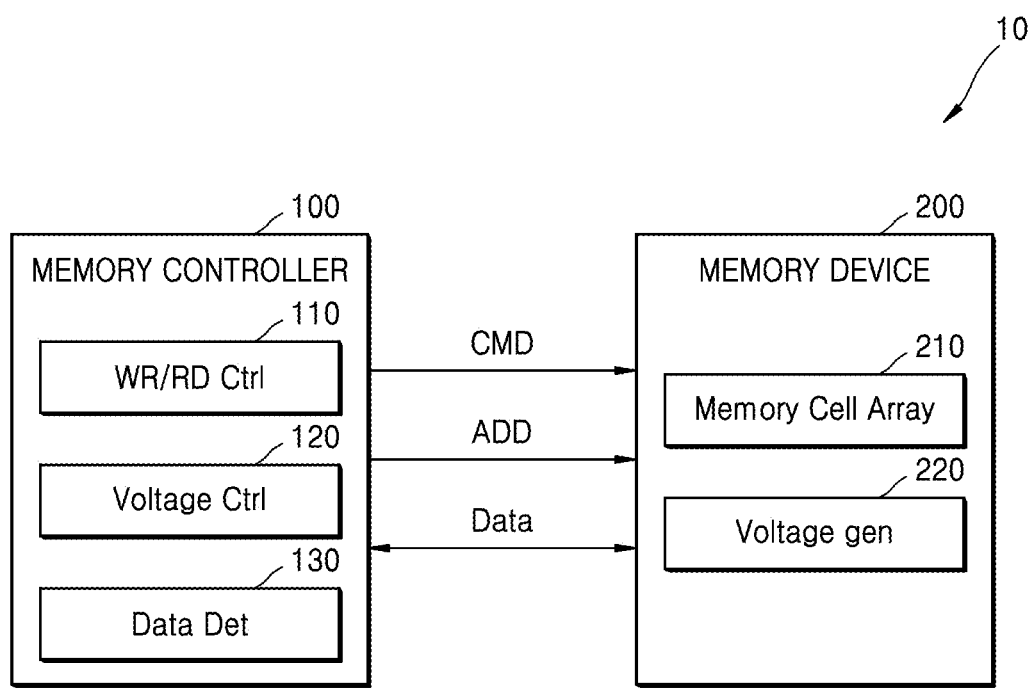
FIG. 1 is a block diagram illustrating a memory system according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a vertical nonvolatile memory device including a memory cell string will be described in detail with reference to the accompanying drawings. In the drawings, like reference numerals refer to like elements, and a size of each element in the drawings may be exaggerated for clarity and convenience of description. In addition, the embodiments to be described below are merely examples, and various modifications are possible from the embodiments.

Hereinafter, what is described as "over" or "on" may include not only directly over and in contact but also over without being in contact. A singular expression includes multiple expressions unless the context clearly indicates otherwise. In addition, when a part is described to "include" a certain configuration element, which means that the part may further include other configuration elements, except to exclude other configuration elements unless otherwise stated.

A term "above-described" and similar terminology may be used for the singular and the plural. If a sequence of steps configuring a method is apparently described or there is no contradictive description, the sequence may be performed in a proper order and is not limited to the described order.

In addition, terms such as " . . . unit/portion", "module", and so on described in the specification mean a unit for processing at least one function or operation, which may be implemented as hardware or software or a combination of the hardware and the software.

Connections of lines between configuration elements or connection members illustrated in the drawings represent functional connections and/or physical or circuit connections by way of example and may be replaced or represented as additional various functional connections, physical connections, or circuit connections in the actual device.

All examples or exemplary terms are used simply for the purpose of describing technical concepts in detail, and the scope is not limited by the examples or exemplary terms unless defined by the claims.

FIG. 1 is a block diagram illustrating a memory system according to an embodiment. Referring to FIG. 1, a memory system 10 according to an embodiment may include a memory controller 100 and a memory device 200. The memory controller 100 may perform a control operation for the memory device 200, and as an example, the memory controller 100 may provide an address ADD and a command CMD to the memory device 200, thereby, performing program (or write), read, and erase operations for the memory device 200. In addition, data for a program operation and read data may be transmitted and received between the memory controller 100 and the memory device 200.

The memory device 200 may include a memory cell array 210 and a voltage generation device 220. The memory cell array 210 may include a plurality of memory cells arranged in regions where a plurality of word lines and a plurality of bit lines intersect. The memory cell array 210 may include nonvolatile memory cells that store data in a nonvolatile manner and include flash memory cells such as a NAND flash memory cell array 210 or a NOR flash memory cell array 210 as nonvolatile memory cells. Hereinafter, embodiments of inventive concepts will be described in detail on the assumption that the memory cell array 210 includes the flash memory cell array 210, and thus, the memory device 200 is a nonvolatile memory device.

The memory controller 100 may include a write/read controller 110, a voltage controller 120, and a data determination processor 130.

The write/read controller 110 may generate the address ADD and the command CMD for performing the program, read, and erase operations for the memory cell array 210. In addition, the voltage controller 120 may generate a voltage control signal for controlling at least one voltage level used in the nonvolatile memory device 200. For example, the voltage controller 120 may generate a voltage control signal for controlling a voltage level of a word line for reading data from the memory cell array 210 or programming data to the memory cell array 210.

The data determination processor 130 may perform a discrimination operation for the data read from the memory device 200. For example, the number of on cells and/or off cells among the memory cells may be determined by determining the data read from the memory cells. As an operation example, if a program is performed on a plurality of memory cells, a state of data of the memory cells may be determined by using a desired and/or alternatively predetermined read voltage, and thus, whether or not the program is normally completed for all cells may be determined.

The memory device 200 may include the memory cell array 210 and the voltage generation device 220. As described above, the memory cell array 210 may include non-volatile memory cells, and for example, the memory cell array 210 may include flash memory cells. In addition, the flash memory cells may be implemented in various forms, and for example, the memory cell array 210 may include three-dimensional (or vertical) NAND (VNAND) memory cells.

The memory controller 100, read/write controller 110, voltage controller 120, and data determination processor 130 may implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory controller 100, in conjunction with the read/write controller 110, voltage controller 120, and data determination processor 130 may operate based on control signals for controlling operations of the memory device 200 discussed herein, thereby transforming the memory controller 100—and read/write controller 110, voltage controller 120, and data determination processor 130 therein—into special purpose processing circuitry.

Figure 2:
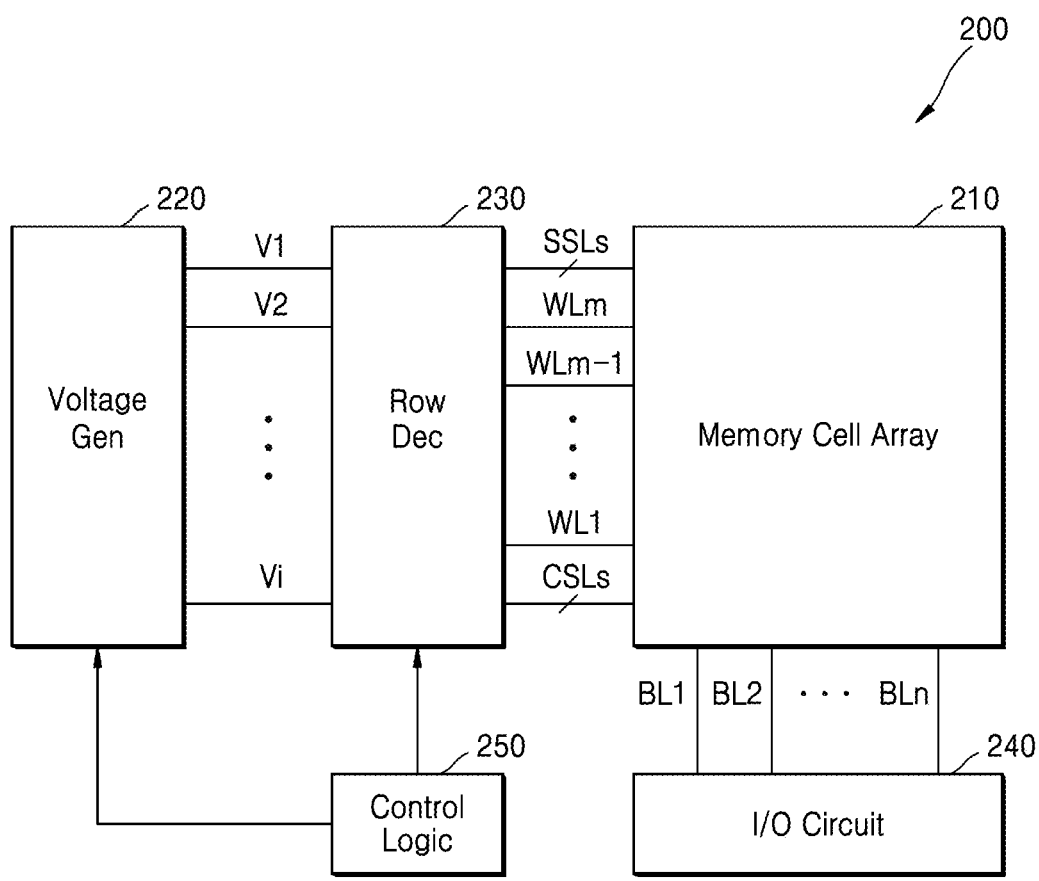
FIG. 2 is a block diagram illustrating an implementation example of a memory device illustrated in FIG. 1.

FIG. 2 is a block diagram illustrating an implementation example of the memory device 200 illustrated in FIG. 1. Referring to FIG. 2, the memory device 200 may further include a row decoder 230, an input/output circuit 240, and a control logic 250.

The memory cell array 210 may be connected to one or more string select lines SSL, a plurality of word lines WL1 to WLm, and one or more common source lines CSLs and may also be connected to a plurality of bit lines BL1 to BLn. The voltage generation device 220 may generate one or more word line voltages V1 to Vi, and the word line voltages V1 to Vi may be provided to the row decoder 230. Signals for program, read, and erase operations may be applied to the memory cell array 210 through the bit lines BL1 to BLn.

In addition, data to be programmed may be provided to the memory cell array 210 through the input/output circuit 240, and the read data may be provided to an external device (for example, a memory controller) through the input/output circuit 240. The control logic 250 may provide various control signals relating to a memory operation to the row decoder 230 and the voltage generation device 220.

The word line voltages V1 to Vi may be provided to various lines SSLs, WL1 to WLm, and CSLs according to a decoding operation of the row decoder 230. For example, the word line voltages V1 to Vi may include a string select voltage, a word line voltage, and a ground select voltage, the string select voltage may be provided to one or more string select lines SSLs, the word line voltage may be provided to one or more word lines WL1 to WLm, and the ground selection voltage may be provided to one or more common source lines CSLs.

The control logic 250, voltage generation device 220, row decoder 230, and input/output circuit 240 may implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The control logic 250, in conjunction with the voltage generation device 220, row decoder 230, and input/output circuit 240, may operate based on control signals for controlling operations of the memory cell array 210 discussed herein, thereby transforming the control logic 250 into special purpose processing circuitry.

Figure 3:
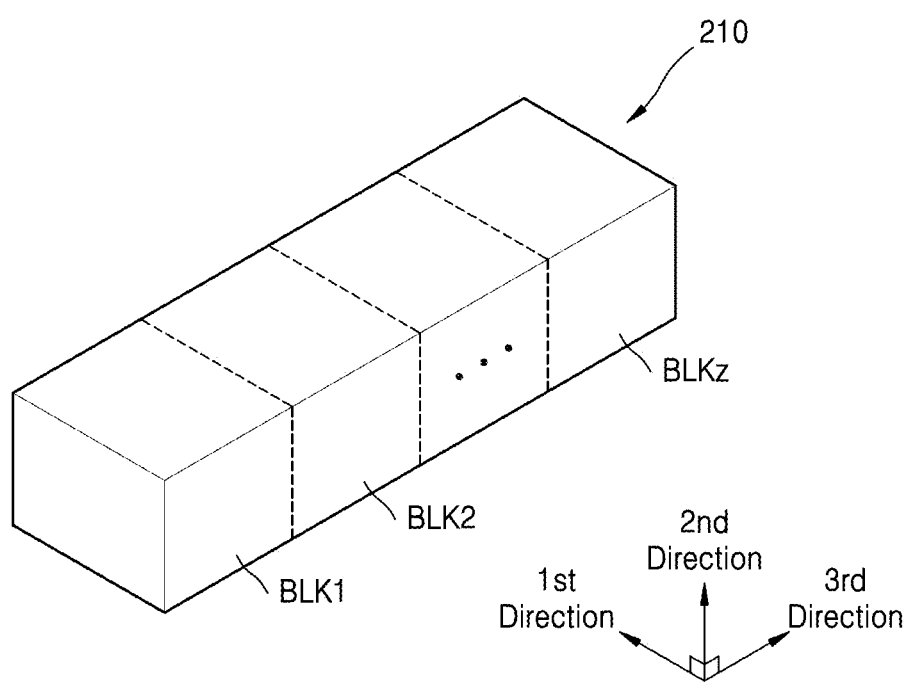
FIG. 3 is a block diagram illustrating a memory cell array illustrated in FIG. 1.

FIG. 3 is a block diagram illustrating the memory cell array illustrated in FIG. 1. Referring to FIG. 3, the memory cell array 210 includes a plurality of memory blocks BLK1 to BLKz. Each memory block BLK has a three-dimensional structure (or vertical structure). For example, each memory block BLK may include structures extending in first to third directions. For example, each memory block BLK may include a plurality of memory cell strings extending in the second direction. In addition, the plurality of memory cell strings may be two-dimensionally arranged in the first and third directions. Each memory cell string is connected to the bit line BL, the string select line SSL, the word line WL, and the common source line CSL. Accordingly, each of the memory blocks BLK1 to BLKz may be connected to a plurality of bit lines BL, a plurality of string select lines SSLs, a plurality of word lines WL, and a plurality of common source lines CSL. The memory blocks BLK1 to BLKz will be described in more detail with reference to FIG. 4.

Figure 4:
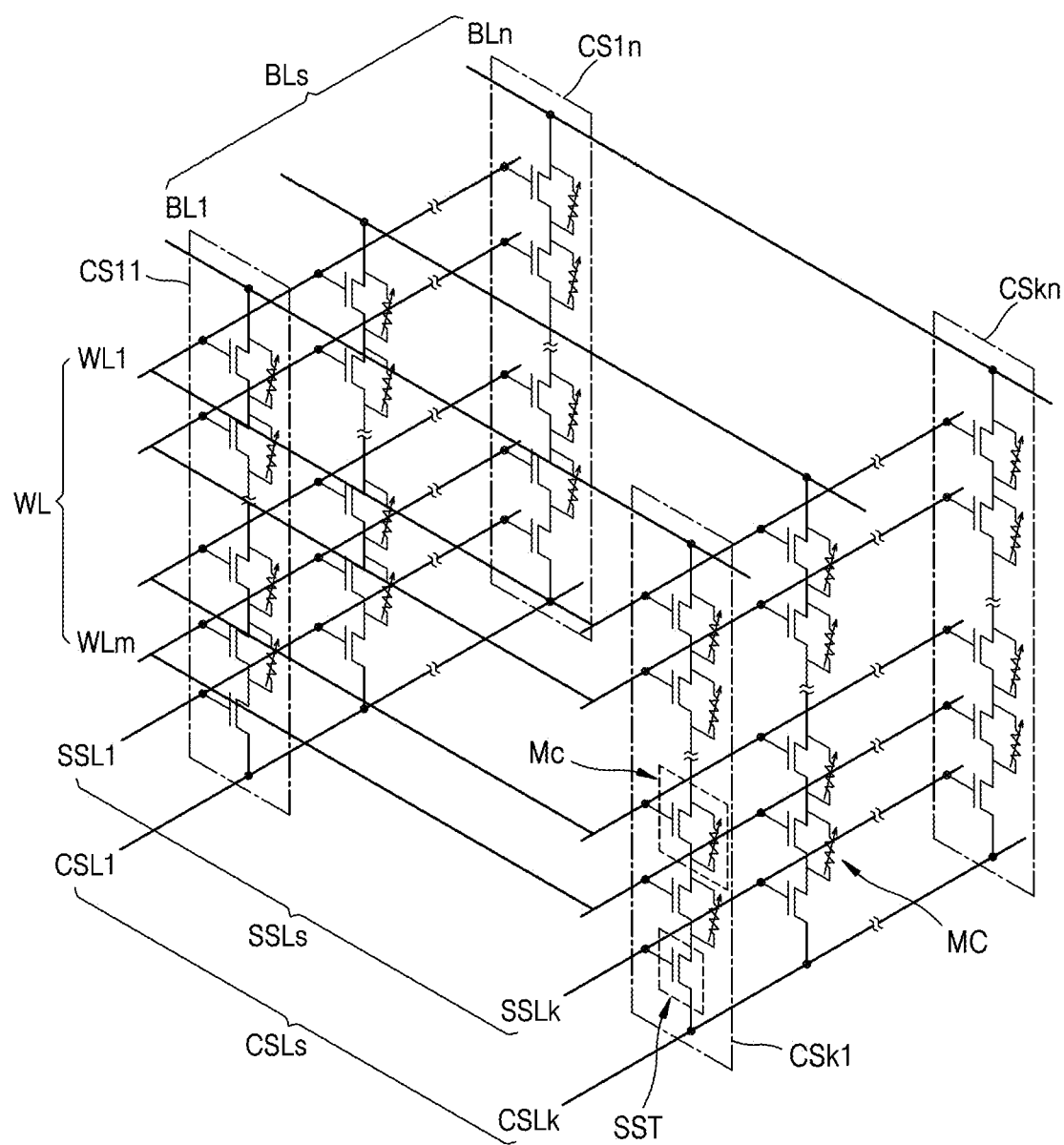
FIG. 4 is a diagram illustrating an equivalent circuit corresponding to a memory block, according to an embodiment.

FIG. 4 is a diagram illustrating an equivalent circuit corresponding to a memory block according to an embodiment. For example, one of the memory blocks BLK1 to BLKz of the memory cell array 210 of FIG. 3 is illustrated in FIG. 4. Referring to FIGS. 3 and 4, each of the memory blocks BLK1 to BLKz includes a plurality of memory cell strings CS11 to CSkn. The plurality of memory cell strings CS11 to CSkn may be arranged two-dimensionally in a row direction and a column direction to form rows and columns. Each of the memory cell strings CS11 to CSkn includes a plurality of memory cells MC and a plurality of string select transistors SST. The memory cells MC and the string select transistors SST in each of the memory cell strings CS11 to CSkn may be stacked in a height direction.

Rows of the plurality of memory cell strings CS11 to CSkn are respectively connected to different string select lines SSL1 to SSLk. For example, the string select transistors SST of the memory cell strings CS11 to CS1$n$ are commonly connected to the string select line SSL1. The string select transistors SST of the memory cell strings CSk1 to CSkn are commonly connected to the string select line SSLk.

In addition, columns of the plurality of memory cell strings CS11 to CSkn are respectively connected to different bit lines BL1 to BLn. For example, the memory cells MC and the string select transistors SST of the memory cell strings CS11 to CSk1 may be commonly connected to the bit line BL1, and the memory cells MC and the string select transistors SST of the memory cell strings CS1$n$ to CSkn may be commonly connected to the bit line BLn.

In addition, rows of the plurality of memory cell strings CS11 to CSkn may be respectively connected to different common source lines CSL1 to CSLk. For example, the string select transistors SST of the plurality of memory cell strings CS11 to CS1$n$ may be commonly connected to the common source line CSL1, and the string select transistors SST of the plurality of memory cell strings CSk1 to CSkn may be commonly connected to the common source line CSLk.

The memory cells MC located at the same height from a substrate (or string select transistors SST) may be commonly connected to one word line WL, and the memory cells MC located at different heights may be respectively connected to different word lines WL1 to WLm.

The memory block illustrated in FIG. 4 is an example. Embodiments of inventive concepts are not limited to the memory block illustrated in FIG. 4. For example, the number of rows of the plurality of memory cell strings CS11 to CSkn may be increased or reduced. As the number of rows of the plurality of memory cell strings CS11 to CSkn changes, the number of string select lines connected to the rows of the memory cell strings CS11 to CSkn and the number of memory cell strings CS11 to CSkn connected to one bit line may also be changed. As the number of rows of the memory cell strings CS11 to CSkn is changed, the number of common source lines connected to the rows of the memory cell strings CS11 to CSkn may also be changed. In addition, the number of columns of the memory cell strings CS11 to CSkn may be increased or reduced. As the number of columns of the memory cell strings CS11 to CSkn changes, the number of bit lines connected to the columns of the memory cell strings CS11 to CSkn, and the number of memory cell strings CS11 to CSkn connected to one string select line may also be changed.

A height of each of the memory cell string CS11 to CSkn may be increased or reduced. For example, the number of memory cells MC stacked on each of the memory cell strings CS11 to CSkn may be increased or reduced. As the number of memory cells MC stacked on each of the memory cell strings CS11 to CSkn is changed, the number of word lines WL may also be changed. For example, the string select transistors provided to each of the memory cell strings CS11 to CSkn may be increased. As the number of string select transistors provided to each of the memory cell strings CS11 to CSkn is changed, the number of string select lines or common source lines may also be changed. If the number of string select transistors is increased, the string select transistors may be stacked in the same form as the memory cells MC.

For example, writing and reading may be performed for each row of the memory cell strings CS11 to CSkn. The memory cell strings CS11 to CSkn may be selected for each row by the common source lines CSLs, and the memory cell strings CS11 to CSkn may be selected for each row by the string select lines SSLs. In addition, in selected rows of the memory cell strings CS11 to CSkn, writing and reading may be performed for each page. For example, the page may be one row of the memory cells MC connected to one word line WL. In selected rows of the memory cell strings CS11 to CSkn, the memory cells MC may be selected for each page by the word lines WL.

Moreover, the memory cells MC in each of the memory cell strings CS11 to CSkn may correspond to a circuit in which a transistor and a resistor are connected in parallel. For example, FIG. 5 is a perspective view schematically illustrating a physical structure corresponding to a memory block according to an embodiment, FIG. 6A is a cross-sectional view illustrating a cross section of an XZ plane of the memory block illustrated in FIG. 5, and FIG. 6B is a cross-sectional view illustrating a cross section of a YZ plane of the memory block illustrated in FIG. 5.

Figure 5:
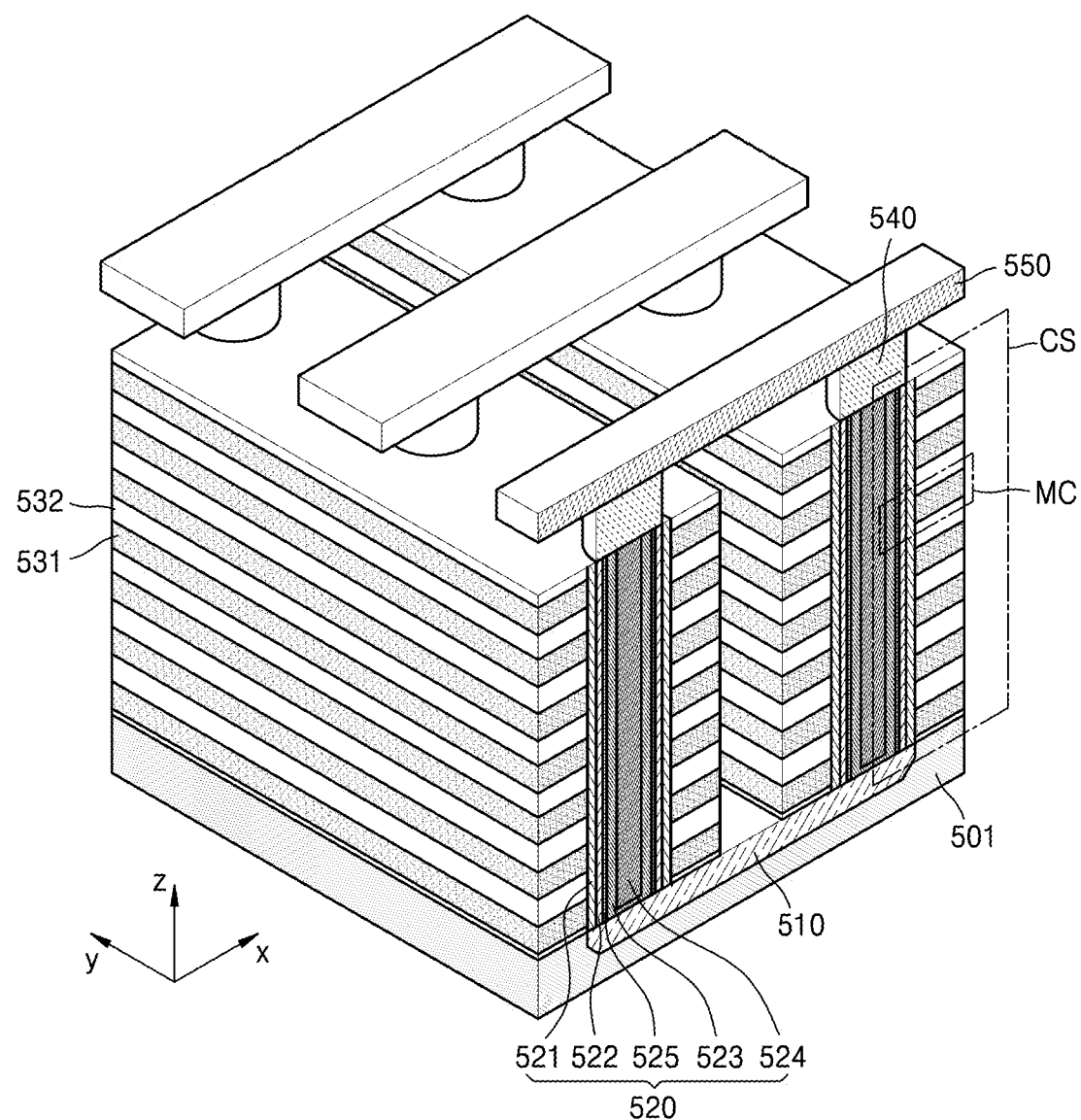
FIG. 5 is a perspective view schematically illustrating a physical structure corresponding to the memory block, according to the embodiment.
Figure 6A:
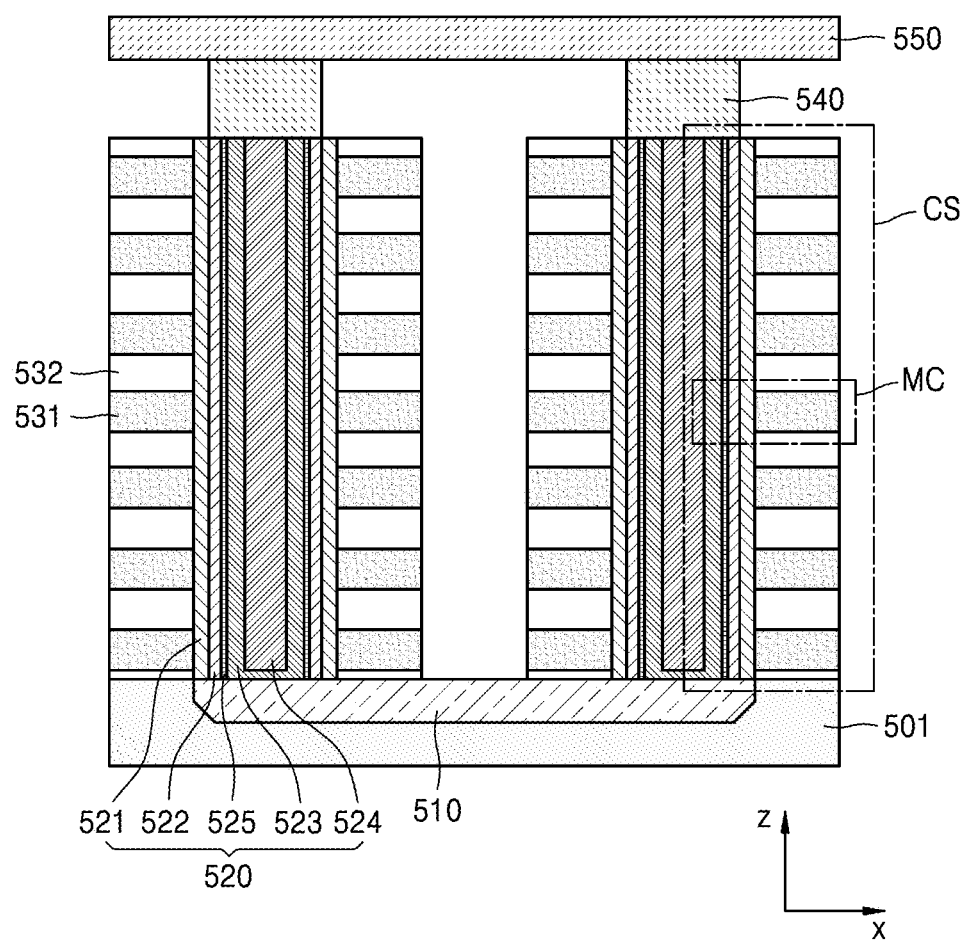
FIG. 6A is a cross-sectional view illustrating a cross section of an XZ plane of the memory block illustrated in FIG. 5.
Figure 6B:
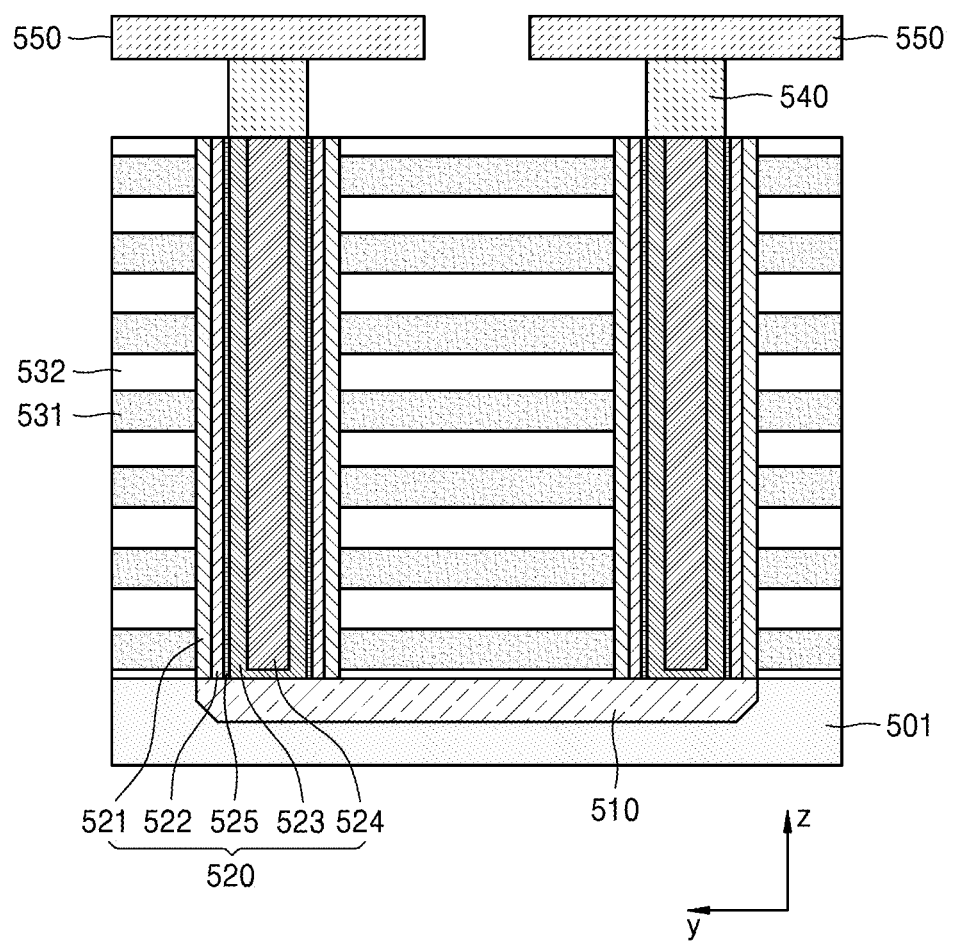
FIG. 6B is a cross-sectional view illustrating a cross section of a YZ plane of the memory block illustrated in FIG. 5.

Referring to FIG. 5, FIG. 6A, and FIG. 6B, the memory block includes a substrate 501. The substrate 501 may include a silicon material doped with a first-type impurity. For example, the substrate 501 may include a silicon material doped with a p-type impurity. The substrate 501 may be, for example, a p-type well (for example, a pocket p-well). Hereinafter, it is assumed that the substrate 501 is p-type silicon, but the substrate 501 is not limited to the p-type silicon.

A doped region 510 is formed in an upper region of the substrate 501. For example, the doped region 510 is a second type region that is electrically opposite to the substrate 501. For example, the doped region 510 is an n-type region. Hereinafter, it is assumed that the doped region 510 is an n-type region. However, the doped region 510 is not limited to the n-type region. The doped region 510 may become a common source line.

A plurality of gates 531 extending in a horizontal direction and a plurality of insulators 532 extending in the horizontal direction may be alternately arranged on the substrate 501. In other words, the plurality of gates 531 and the plurality of insulators 532 may be alternately stacked in a vertical direction orthogonal to the horizontal direction. For example, the gate 531 may include at least one of a metal material (for example, copper, silver, and so on) and silicon doped at a high concentration, the plurality of insulators 532 may include a silicon oxide, and inventive concepts are not limited thereto. Each of the gates 531 is connected to one of the word line WL and the string selection line SSL.

In addition, the memory block includes a plurality of pillars 520 penetrating the plurality of gates 531 and the plurality of insulator 532 alternately arranged in the vertical direction. Each of the pillars 520 may be configured by a plurality of layers in the horizontal direction. In one embodiment, an outermost layer of the pillar 520 may be a gate insulating layer 521. For example, the gate insulating layer 521 may include a silicon oxide. The gate insulating layer 521 may be conformally deposited on the plurality of gates 531 and the plurality of insulators 532 to extend in the vertical direction.

In addition, a semiconductor layer 522 may be conformally deposited along a surface of the gate insulating layer 521 to extend in the vertical direction. In one embodiment, the semiconductor layer 522 may include a silicon material doped with the first-type impurity. The semiconductor layer 522 may include a silicon material doped with the same type impurity as the substrate 501, and for example, when the substrate 501 includes a silicon material doped with a p type impurity, the semiconductor layer 522 may also include a silicon material doped with the p-type impurity. Alternatively, the semiconductor layer 522 may also include materials such as Ge, indium gallium zinc oxide (IGZO), and GaAs.

A dielectric film 525 (also referred to as a dielectric layer) may be conformally deposited along a surface of the semiconductor layer 522 to extend in the vertical direction. The dielectric film 525 may be formed of a mixture of a material of the semiconductor layer 522 and a material of a resistance change layer 523 which will be described below.

The resistance change layer 523 may be disposed along a surface of the dielectric film 525. The resistance change layer 523 may be disposed to be in direct contact with the dielectric film 525 and may be conformally deposited on the dielectric film 525. In one embodiment, the resistance change layer 523 may be formed of a material of which resistance changes depending on an applied voltage. The resistance change layer 523 may change from a high resistance state to a low resistance state or a low resistance state to a high resistance state depending on a voltage applied to the gate 531. For example, the resistance change layer 523 may include a transition metal oxide. Specifically, the resistance change layer 523 may include an oxide of at least one element selected from a group including zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), and praseodymium (Pr).

The dielectric film 525 may be formed of a mixture of the transition metal oxide and the material of the semiconductor layer 522 described above. For example, when the semiconductor layer 522 is made of silicon (Si) and the resistance change layer 523 is formed of $HfO_2$, the dielectric film 525 may be formed of hafnium silicate (Hf silicate, $HfSi_xO_y$). As another example, when the semiconductor layer 522 is formed of germanium (Ge) and the resistance change layer 523 is formed of $Al_2O_3$, the dielectric film 525 may be formed of $AlGe_xO_y$. Here, x and y may change depending on a ratio the material of the semiconductor layer 522 to the material of the resistance change layer 523 in the dielectric film 525. In addition to this, various mixtures may be used as the dielectric film 525.

The dielectric film 525 may change from a high resistance state to a low resistance state or a low resistance state to a high resistance state together with the resistance change layer 523 depending on the voltage applied to the gate 531. Particularly, a plurality of movable oxygen vacancies are distributed in the dielectric film 525, and thus, a resistance state of the dielectric film 525 may be easily changed by a phenomenon in which electrons are trapped or detrapped in traps formed by oxygen vacancies Accordingly, the dielectric film 525 substantially provides a change in resistance, and the resistance change layer 523 may provide a resistance change material to the dielectric film 525.

A proportion of the material of the semiconductor layer 522 in the dielectric film 525 may be appropriately selected so that a sufficient amount of oxygen vacancies may be generated inside the dielectric film 525. For example, the proportion of the material of the semiconductor layer 522 in the dielectric film 525 may change depending on a transition metal oxide and a semiconductor material which are used and may be about 20 at. % to about 80 at. %. Alternatively, the proportion of the material of the semiconductor layer 522 in the dielectric film 525 may be, for example, about 40 at. % to about 60 at. %.

During a process of forming the memory block, a mixture thin film formed of a mixture of the material of the semiconductor layer 522 and the material of the resistance change layer 523 may be naturally formed at an interface between the semiconductor layer 522 and the resistance change layer 523. However, the naturally formed mixture thin film does not have a uniform composition. In the disclosed embodiment, the dielectric film 525 is intentionally formed between the semiconductor layer 522 and the resistance change layer 523. The intentionally formed dielectric film 525 as such may have a relatively uniform composition over the entire region of the dielectric film 525. For example, the proportion of the material of the semiconductor layer 522 in the dielectric film 525 may be maintained constant within a deviation range of about 10% in the entire region of the dielectric film 525.

In addition, a width of the dielectric film 525 may be selected to obtain a distance in which the oxygen vacancy may move in the horizontal direction. For example, the width of the dielectric film 525 in the horizontal direction may be selected within a range of about 1.5 nm to about 10 nm. The mixture thin film naturally formed between the material of the semiconductor layer 522 and the material of the resistance change layer 523 does not have a uniform width. Moreover, the intentionally formed dielectric film 525 may have a relatively uniform width over the entire region of the dielectric film 525. For example, the width of the dielectric film 525 may be maintained constant within a deviation range of about 10% in the entire region of the dielectric film 525.

An insulating support 524 may be disposed inside the resistance change layer 523. For example, the insulating support 524 may include a silicon oxide. One insulating support 524, and the resistance change layer 523, the dielectric film 525, the semiconductor layer 522, the gate insulating layer 521, the plurality of gates 531, and the plurality of insulators 532 which are sequentially arranged outside the insulating support 524 configure one memory cell string CS. Accordingly, the insulating support 524 is disposed at the center of the memory cell string CS. The semiconductor layer 522, and the dielectric film 525 and the resistance change layer 523 which are sequentially disposed on an inner surface of the semiconductor layer 522 may be in contact with the doped region 510, that is, the common source region to be electrically connected to the common source region. The gates 531 and the insulators 532 arranged on an outer surface of the gate insulating layer 521 may not be in contact with the doped region 510.

A drain 540 may be disposed on the pillar 520. The drain 540 may include a silicon material doped with a second-type impurity. For example, the drain 540 may include a silicon material doped with an n-type impurity. A bit line 550 may be disposed on the drain 540. The drain 540 and the bit line 550 may be connected through a contact plug. The bit line 550 may include a metal material, and for example, the bit line 550 may include polysilicon. The bit line 550 may include a conductive material.

Moreover, when compared with FIG. 4, the plurality of gates 531, the plurality of insulators 532, the gate insulating layer 521, the semiconductor layer 522, the dielectric film 525 and the resistance change layer 523 are configuration elements of the memory cell string CS. Specifically, the gate 531, the gate insulating layer 521, and the semiconductor layer 522 may be configuration elements of the transistor, and the resistance change layer 523 and the dielectric film 525 may become a resistor. In addition, any one of the gates 531, a part of the gate insulating layer 521 adjacent to the one gate 531 in the horizontal direction, a part of the semiconductor layer 522, a part of the dielectric film 525, and a part of the resistance change layer 523 are configuration elements of one memory cell MC. The plurality of memory cells MC are arranged in a vertical stacked structure to form each memory cell string CS.

The dielectric film 525 and the resistance change layer 523 may have a high resistance state or a low resistance state, and thus, "0" and "1" may be written to the memory cell MC. In each memory cell MC, the semiconductor layer 522 of the transistor is connected in parallel to the dielectric film 525 and the resistance change layer 523, and the parallel structures are continuously arranged in the vertical direction to form the memory cell string CS. In addition, the common source line 510 and the bit line 550 may be connected to both ends of the memory cell string CS, respectively. In addition, program, read, and erase processes may be performed for the plurality of memory cells MC by applying voltages to the common source line 510 and the bit line 550.

According to the present embodiment, a memory block is configured by using the resistance change layer 523 instead of using a phase change material, and thus, a heat generation problem, a stress (pressure) problem, and so on due to use of the phase change material may be reduced. In addition, by configuring the memory block and operating the memory block as described above, ion movement between adjacent memory cells, a leakage current due to the ion movement, and an operation failure may be limited and/or prevented even when the memory cells included in the memory block are repeatedly operated. In addition, the memory block according to the present embodiment may solve a scaling issue between memory cells of a next-generation vertical NAND (VNAND), and thus, density may be dramatically increased. Accordingly, a memory capacity may be greatly increased. Particularly, a resistance state may be changed more easily and accurately by disposing the dielectric film 525 through which oxygen vacancies may move between the semiconductor layer 522 and the resistance change layer 523.

Moreover, the memory block according to the present embodiment may be implemented in the form of a chip to be used as a Neuromorphic Computing platform. In addition, the memory block according to inventive concepts may be implemented in the form of a chip to be used for configuring a Neural Network.

Figure 7:
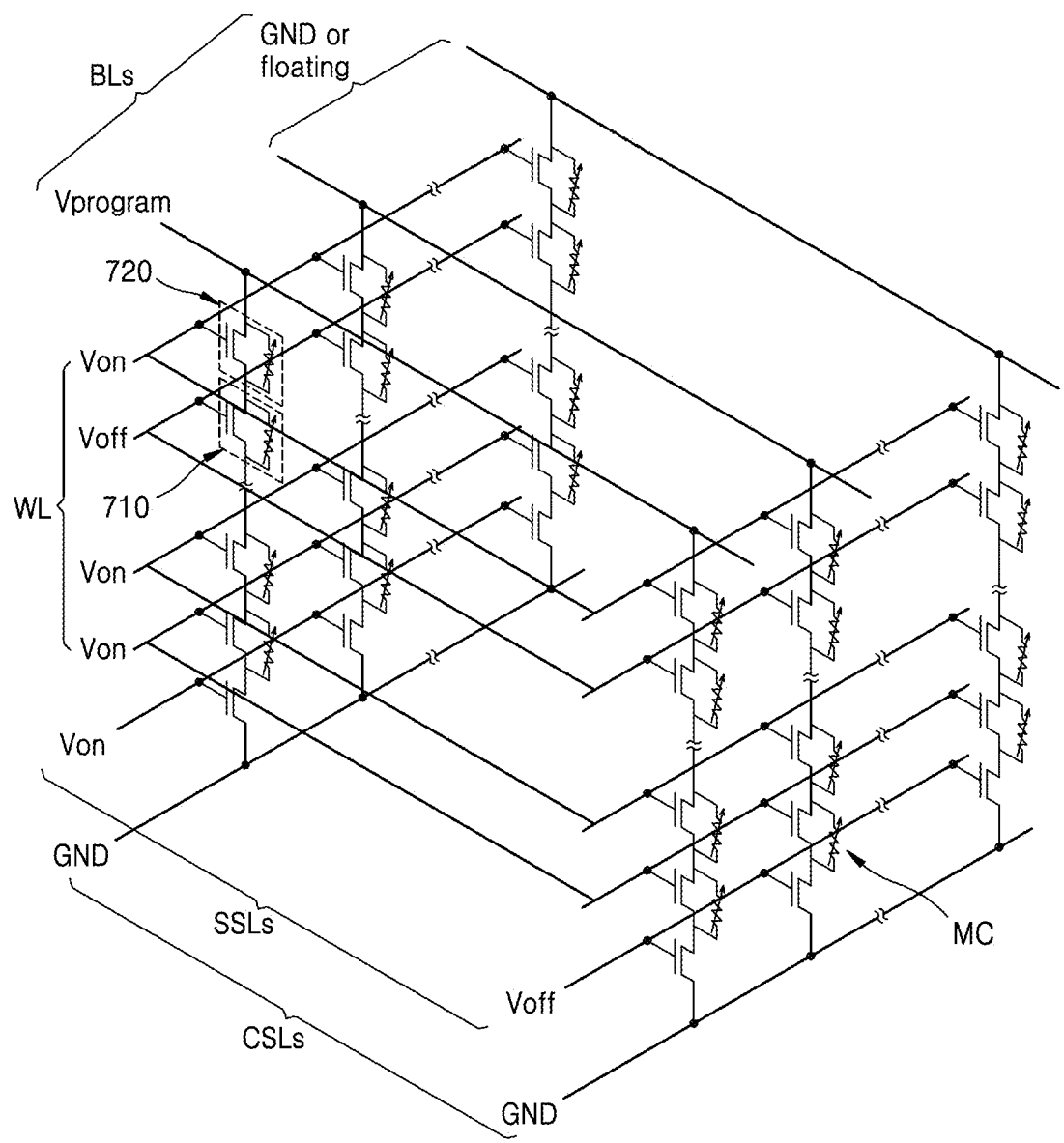
FIG. 7 is a diagram illustrating an equivalent circuit of a memory block according to FIG. 4 in a program mode of a nonvolatile memory device, according to an embodiment.

FIG. 7 is a diagram illustrating an equivalent circuit of the memory block according to FIG. 4 in a program mode of a nonvolatile memory device according to an embodiment. A plurality of memory cells 710 and 720 illustrated in FIG. 7 may include the gate 531, the gate insulating layer 521, the semiconductor layer 522, the dielectric film 525, and the resistance change layer 523 illustrated in FIG. 5.

The plurality of memory cells 710 and 720 of the memory block may be divided into a selected memory cell 710 and an unselected memory cell 720. A program mode of a nonvolatile memory device refers to a mode for performing a program operation for a memory cell included in the memory block, and the selected memory cell 710 may refer to a memory cell that is a target of a program operation.

The control logic 250 may control a turn-on voltage Von to be applied to the string select line SSL connected to the selected memory cell 710 among the plurality of string select lines SSLs. The control logic 250 may apply the turn-on voltage Von to the word line WL connected to the unselected memory cells 720 among the plurality of word lines WL and may apply the turn-off voltage Voff to the word line WL connected to the selected memory cell 710 among the plurality of word lines WL. Here, the turn-on voltage Von turns on the transistor and may also be referred to as a voltage that causes a current to flow through only a semiconductor layer of the transistor. The turn-off voltage Voff turns off the transistor and may also be referred to as a voltage that limits and/or prevents a current from flowing through the semiconductor layer of the transistor. Values of the turn-on voltage Von and the turn-off voltage Voff may change depending on types, thicknesses, and so on of materials forming the gate 531, the gate insulating layer 521, the semiconductor layer 522, the dielectric film 525, and the resistance change layer 523 which configure the plurality of memory cells MC. In general, an absolute value of the turn-on voltage Von may be greater than an absolute value of the turn-off voltage Voff.

In addition, a program voltage Vprogram may be applied to the bit line BL connected to the selected memory cell 710 among the plurality of bit lines BLs. The program voltage Vprogram may be provided from the outside, for example, the memory controller 100 through the input/output circuit 240. The program voltage Vprogram is a voltage for recording data in the memory cell MC, and a value of the program voltage Vprogram may change depending on the data.

The bit line BL not connected to the selected memory cell 710 among the plurality of bit lines BLs may be grounded or floated. As the bit line not connected to the selected memory cell 710 is grounded or floated, power loss due to a leakage current may be limited and/or prevented. Then, the control logic 250 may perform a program operation for the selected memory cell 710.

In the program mode, as the turn-on voltage Von is applied to the unselected memory cell 720, the semiconductor layer 522 of the unselected memory cell 720 has conductor characteristics, and as the turn-off voltage Voff is applied to the selected memory cell 710, the semiconductor layer 522 of the selected memory cell 710 has insulation characteristics. Accordingly, a voltage difference according to the program voltage Vprogram is generated in the selected memory cell 710. The dielectric film 525 and the resistance change layer 523 of the selected memory cell 710 may be in a low resistance state as oxygen vacancies move toward the semiconductor layer 522 due to the voltage difference in the selected memory cell 710. That the dielectric film 525 and the resistance change layer 523 of the selected memory cell 710 are in a low resistance state may mean that a value of resistance included in the selected memory cell 710 is reduced. The selected memory cell 710 may have ohmic conduction characteristics in the low resistance state of the dielectric film 525 and the resistance change layer 523.

Figure 8:
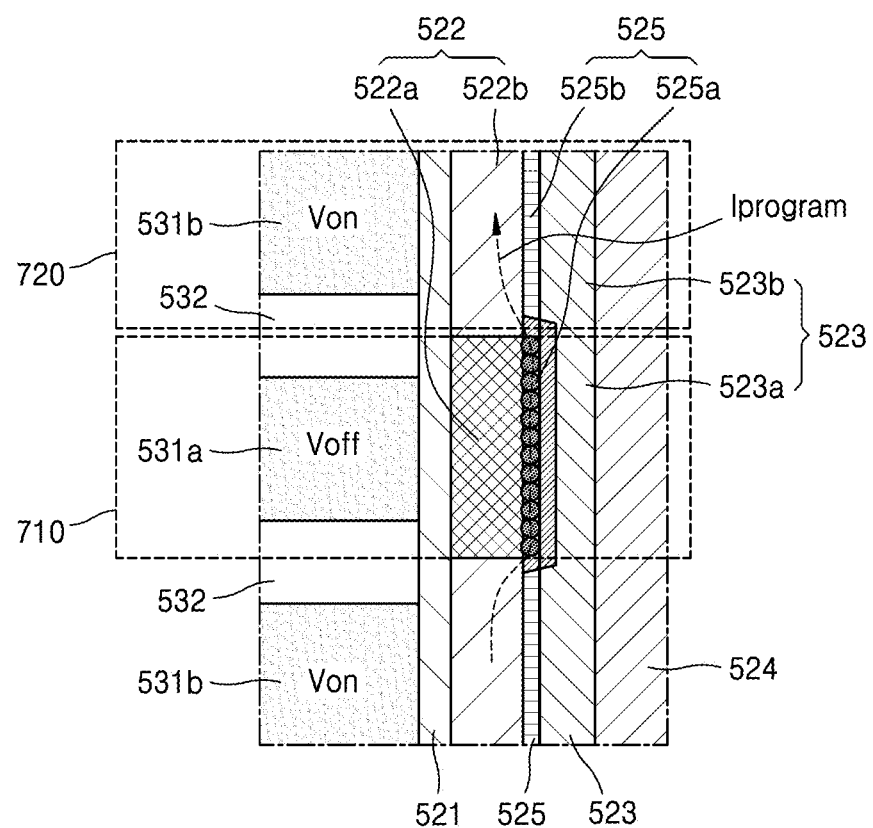
FIG. 8 is a diagram schematically illustrating current movement in a dielectric film and a resistance change layer in a program mode, according to an embodiment.

FIG. 8 is a diagram schematically illustrating a current movement in the dielectric film 525 and the resistance change layer 523 in the program mode according to an embodiment. Referring to FIG. 8, the memory block may include the gate 531, the insulator 532, the gate insulating layer 521, the semiconductor layer 522, the dielectric film 525, the resistance change layer 523, and the insulating support 524. The gate insulating layer 521, the semiconductor layer 522, the dielectric film 525, the resistance change layer 523, and the insulating support 524 may extend in a vertical direction. The gate 531 and the insulator 532 may extend in a horizontal direction and may be alternately stacked in the vertical direction. The gate 531, the gate insulating layer 521, and the semiconductor layer 522 may be one configuration element of the transistor, and the dielectric film 525 and the resistance change layer 523 may correspond to a resistor.

In the program mode, the control logic 250 performs control such that the turn-on voltage Von is applied to a gate 531b of the unselected memory cell 720 and the turn-off voltage Voff is applied to a gate 531a of the selected memory cell 710. Then, a semiconductor layer 522b corresponding to the gate 531b of the unselected memory cell 720 may have conductor characteristics, and a semiconductor layer 522a corresponding to the gate 531a of the selected memory cell 710 may have insulation characteristics. As a positive (+) program voltage Vprogram is applied to a bit line electrically connected to the selected memory cell 710, a voltage difference is generated between upper portions and lower portions of the dielectric film 525a and the resistance change layer 523a corresponding to the selected memory cell 710 and a program current Iprogram may flow through the semiconductor layer 522b corresponding to the gate 531b of the unselected memory cell 720.

The voltage difference causes oxygen vacancies inside the dielectric film 525a corresponding to the selected memory cell 710 to be directed in a direction of the semiconductor layer 522a. As illustrated in FIG. 8, when a density of the oxygen vacancies is high in a region of the dielectric film 525a close to the semiconductor layer 522a, a conductive filament is formed. Accordingly, the dielectric film 525a and the resistance change layer 523a corresponding to the selected memory cell 710 enter a low resistance state due to a change in a current conduction shape. Particularly, most of the resistance change occurs inside the dielectric film 525a. At this time, the selected memory cell 710 may have ohmic conduction characteristics. In other words, the selected memory cell 710 may have bulk conduction characteristics such as hopping, SCLC, and poole-frenkel. As a result, resistance states of the dielectric film 525a and the resistance change layer 523a of the selected memory cell 710 change in response to the program voltage Vprogram, and thus, the selected memory cell 710 performs a program operation.

Moreover, the voltage difference is not generated between the upper portions and the lower portions of the dielectric film 525b and the resistance change layer 523b of the unselected memory cell 720. Accordingly, the oxygen vacancies do not move inside the dielectric film 525b and the resistance change layer 523b corresponding to the unselected memory cell 720.

Moreover, in an erase mode, a negative (−) erase voltage Verase is applied to a bit line electrically connected to the selected memory cell 710. Then, oxygen vacancies are scattered in the dielectric film 525a and the resistance change layer 523a corresponding to the selected memory cell 710, and thus, the dielectric film 525a and the resistance change layer 523a corresponding to the selected memory cell 710 may enter a high resistance state.

Figure 9:
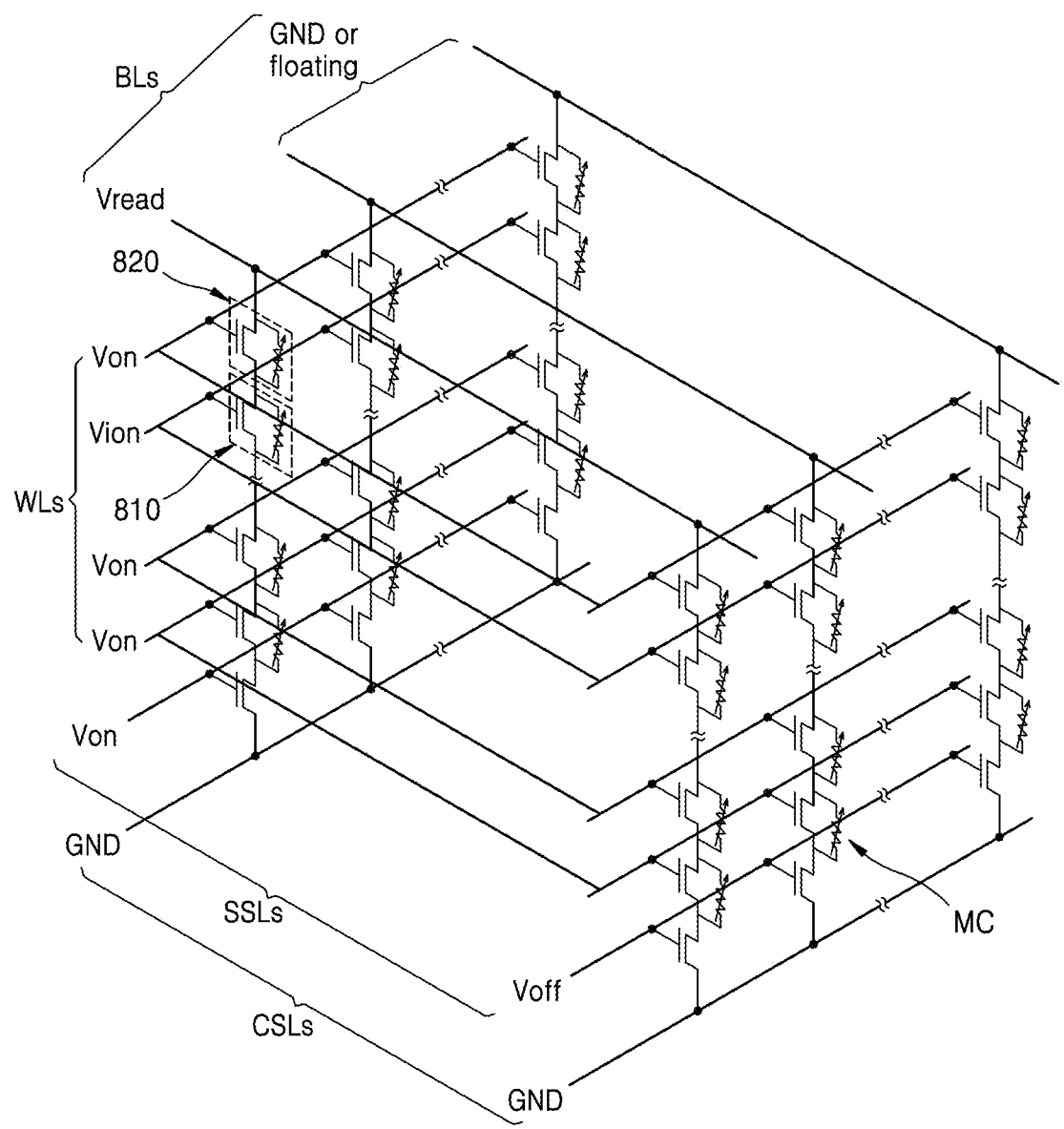
FIG. 9 is a diagram illustrating a circuit in a read mode of a memory block, according to an embodiment.

FIG. 9 is a diagram illustrating a circuit in a read mode of a memory block according to an embodiment. Each of a plurality of memory cells 810 and 820 illustrated in FIG. 9 may include the gate 531, the gate insulating layer 521, the semiconductor layer 522, the dielectric film 525, and the resistance change layer 523 illustrated in FIG. 5. The memory cells 810 and 820 of the memory block may be divided into a selected memory cell 810 and an unselected memory cell 820. A read mode of a nonvolatile memory device may refer to a mode in which a read operation is performed for a memory cell included in a memory block, and the selected memory cell 810 may refer to a memory cell that is a target of the read operation.

In the read mode, the control logic 250 may apply the turn-on voltage Von to the string select line SSL connected to the selected memory cell 810 among the plurality of string selection lines SSLs and may apply the turn-on voltage Von to the word line WL connected to the unselected memory cell 820 among the plurality of word lines WL. Here, the turn-on voltage Von turns on the transistor and may also be referred to as a voltage that causes a current to flow through only the semiconductor layer 522 of the transistor. The turn-off voltage Voff turns off the transistor and may also be referred to as a voltage that limits and/or prevents a current from flowing through the semiconductor layer 522 of the transistor. The turn-on voltage Von and the turn-off voltage Voff may change depending on types, thicknesses, and so on of the materials forming the gate 531, the gate insulating layer 521, the semiconductor layer 522, the dielectric film 525, and the resistance change layer 523 that configure the plurality of memory cells MC. In general, an absolute value of the turn-on voltage Von may be greater than an absolute value of the turn-off voltage Voff.

In addition, the control logic 250 may apply a current-on voltage Vion to the word line WL connected to the selected memory cell 810. The current-on voltage Vion refers to a voltage having a value that causes a current to flow through all of the semiconductor layer 522, the dielectric film 525, and the resistance change layer 523 of the transistor included in the selected memory cell 810. An absolute value of the current-on voltage Vion may be greater than the absolute value of the turn-off voltage Voff and may be less than the absolute value of the turn-on voltage Von. A value of the current-on voltage Vion may change depending on types, thicknesses, and so on of materials forming the gate 531, the gate insulating layer 521, the semiconductor layer 522, the dielectric film 525, and the resistance change layer 523 that configure the plurality of memory cells. Particularly, the current-on voltage Vion may have a value that causes a resistance distribution of the selected memory cell 810 to have a linear scale.

In addition, a read voltage Vread may be applied to the bit line BL connected to the selected memory cell 810 among the plurality of bit lines BLs. The read voltage Vread may be provided from the outside, for example, the memory controller 100 through the input/output circuit 240. The read voltage Vread may be a voltage for reading data recorded in the selected memory cell 810. The bit line BL not connected to the selected memory cell 810 among the plurality of bit lines BLs may be grounded or floated. Then, a read operation for the selected memory cell 810 may be performed.

Figure 10:
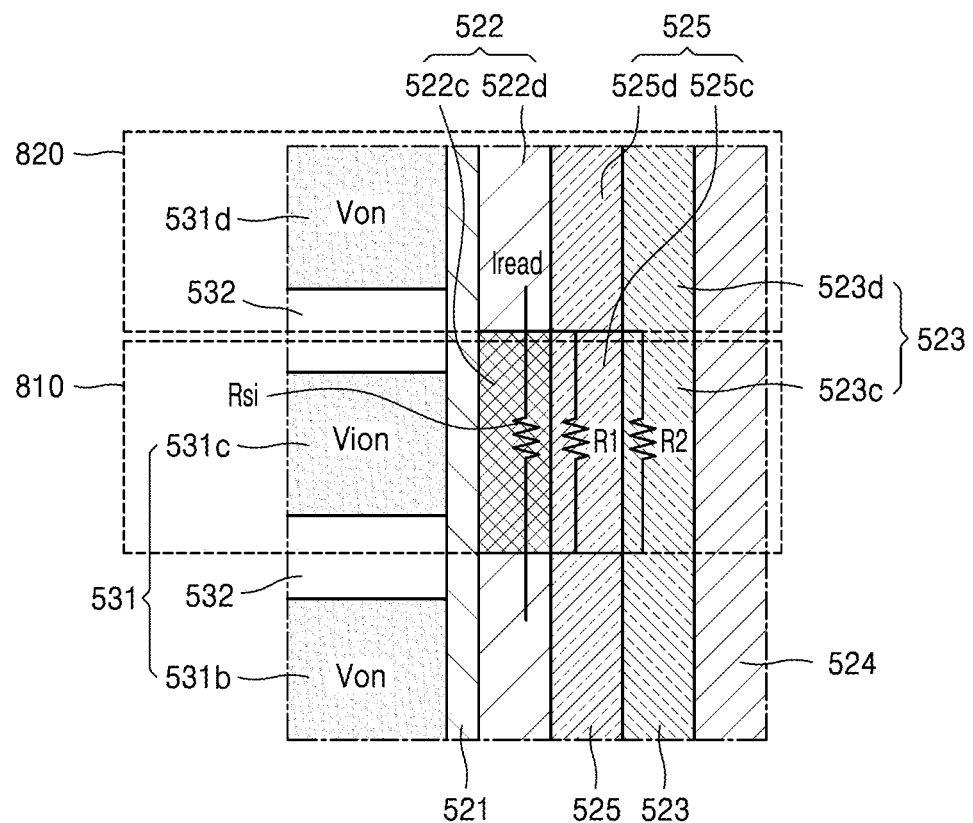
FIG. 10 is a diagram illustrating current movement in a selected memory cell in a read mode, according to an embodiment.

FIG. 10 is a diagram illustrating a current movement in a selected memory cell in a read mode according to an embodiment. Referring to FIG. 10, in the read mode, the read voltage Vread is applied to the bit line BL connected to the selected memory cell 810 and the turn-on voltage Von is applied to the unselected memory cell 820 and thus, the semiconductor layer 522d of the unselected memory cell 820 has conductor characteristics. Therefore, a read current Iread flows through a semiconductor layer 522d of the unselected memory cell 820. However, the current-on voltage Vion is applied to the selected memory cell 810, and thus, the read current flows through a semiconductor layer 522c, a dielectric film 525c, and a resistance change layer 523c of the selected memory cell 810.

The current-on voltage Vion may have a value that causes the resistance Rsi of the semiconductor layer 522c to be similar to a combined resistance of the resistance R1 of the dielectric film 525c and the resistance R2 of the resistance change layer 523c. A composite resistance is formed by connecting a resistance R1 of the dielectric film 525c and a resistance R2 of the resistance change layer 523c in parallel. For example, a value of the current-on voltage Vion may be selected such that a resistance Rsi of the semiconductor layer 522c corresponding to the selected memory cell 810 is greater than or equal to a minimum resistance of the combined resistance of the resistance R1 of the dielectric film 525c and the resistance R2 of the resistance change layer 523c, or the resistance Rsi of the semiconductor layer 522c of the selected memory cell 810 is less than or equal to a maximum resistance of the combined resistance of the resistance R1 of the dielectric film 525c and the resistance R2 of the resistance change layer 523c of the selected memory cell 810.

As a result, a total resistance of the selected memory cell 810 may be determined by a parallel resistance of the resistance Rsi of the semiconductor layer 522c, the resistance R1 of the dielectric film 525c, and the resistance R2 of the resistance change layer 523c. The read current does not flow through a dielectric film 525d and a resistance change layer 523d of the unselected memory cell 820 and flows through only the semiconductor layer 522d. Accordingly, the read current may be determined by the total resistance of the selected memory cell 810. Then, the total resistance of the selected memory cell 810 may be determined by measuring a strength of the read current.

Figure 11:
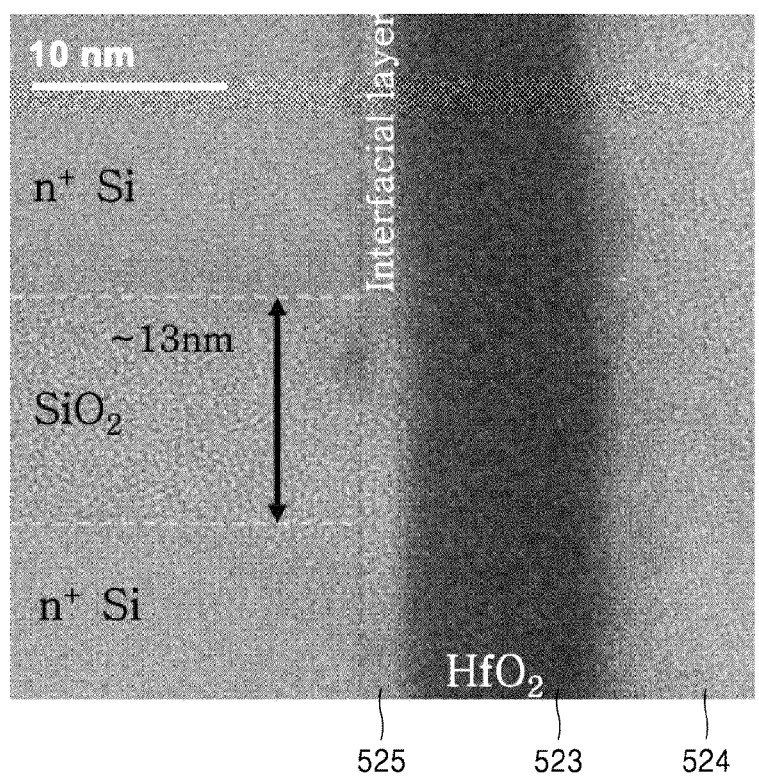
FIG. 11 is a transmission electron microscope (TEM) photograph illustrating a structure designed to test an operation of a memory cell, according to an embodiment.

FIG. 11 is a transmission electron microscope (TEM) photograph illustrating a structure designed to test an operation of a memory cell according to an embodiment. Referring to FIG. 11, a $SiO_2$ layer is stacked on the doped $n^+Si$ layer, and the doped $n^+Si$ layer is stacked on the $SiO_2$ layer. Then, the dielectric film 525, the resistance change layer 523, and the insulating support 524 are formed on a side surface of a $n^+Si/SiO_2/n^+Si$ stacked structure. The doped $n^+Si$ layer is used as a semiconductor layer of the turned-on unselected memory cell, and the $SiO_2$ layer is used as a semiconductor layer of the turned-off selected memory cell. HfSiO is used as the dielectric film 525, and $HfO_2$ is used as the resistance change layer 523.

Figure 12:
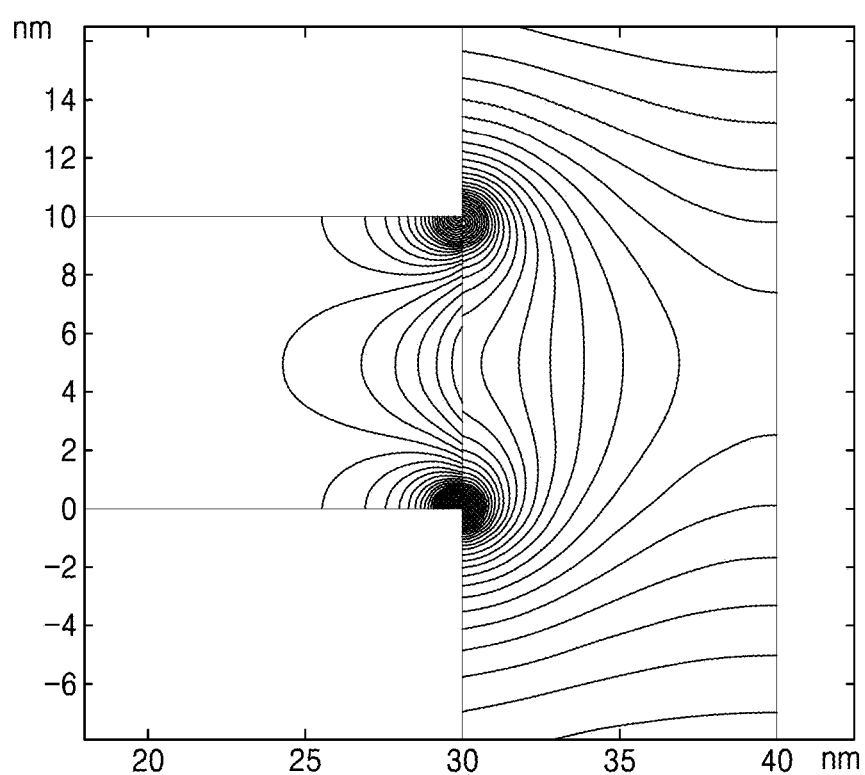
FIG. 12 illustrates a result of simulating an electric field distribution under an operation condition for resistance change induction in the structure illustrated in FIG. 11.
Figure 13:
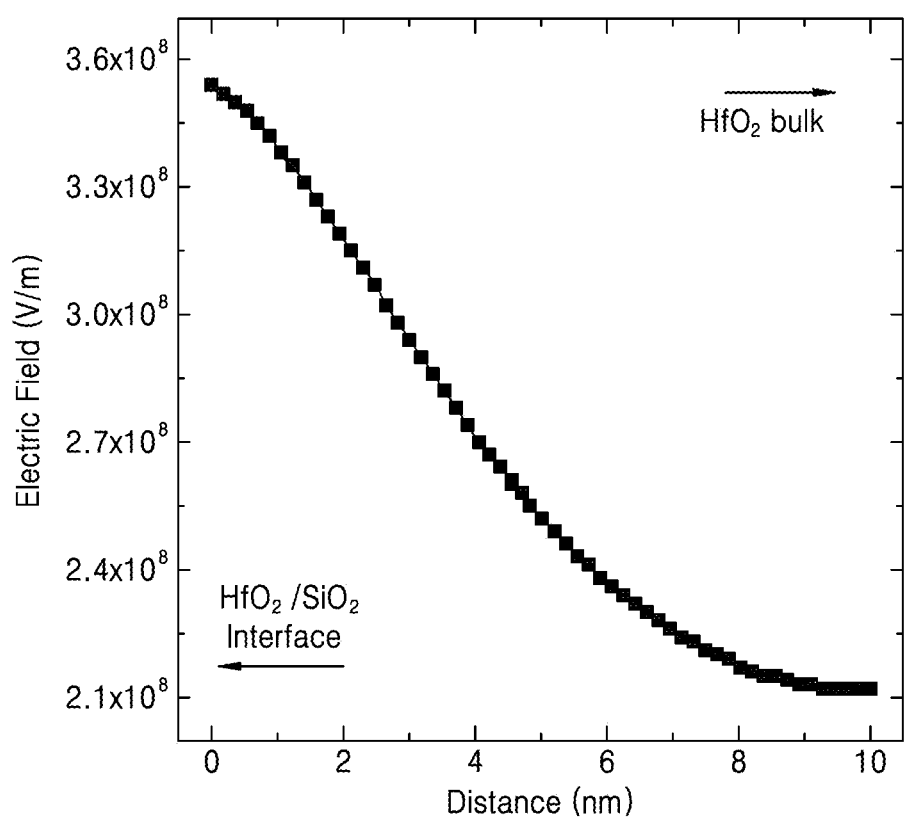
FIG. 13 is a graph illustrating a change in intensity of an electric field according to a horizontal distance in the structure illustrated in FIG. 11.

FIG. 12 illustrates a result of simulating an electric field distribution under an operation condition for inducing a resistance change in the structure illustrated in FIG. 11, and FIG. 13 is a graph illustrating a change in strength of an electric field according to a horizontal distance in the structure illustrated in FIG. 11. As a result of simulating the electric field distribution by applying a voltage of −5V to the doped $n^+Si$ layer, it may be seen that the electric field is concentrated on an interface between the $SiO_2$ layer and the dielectric film 525. Accordingly, it may be expected that a resistance change phenomenon is induced in the dielectric film 525 where the electric field is concentrated.

Figure 14:
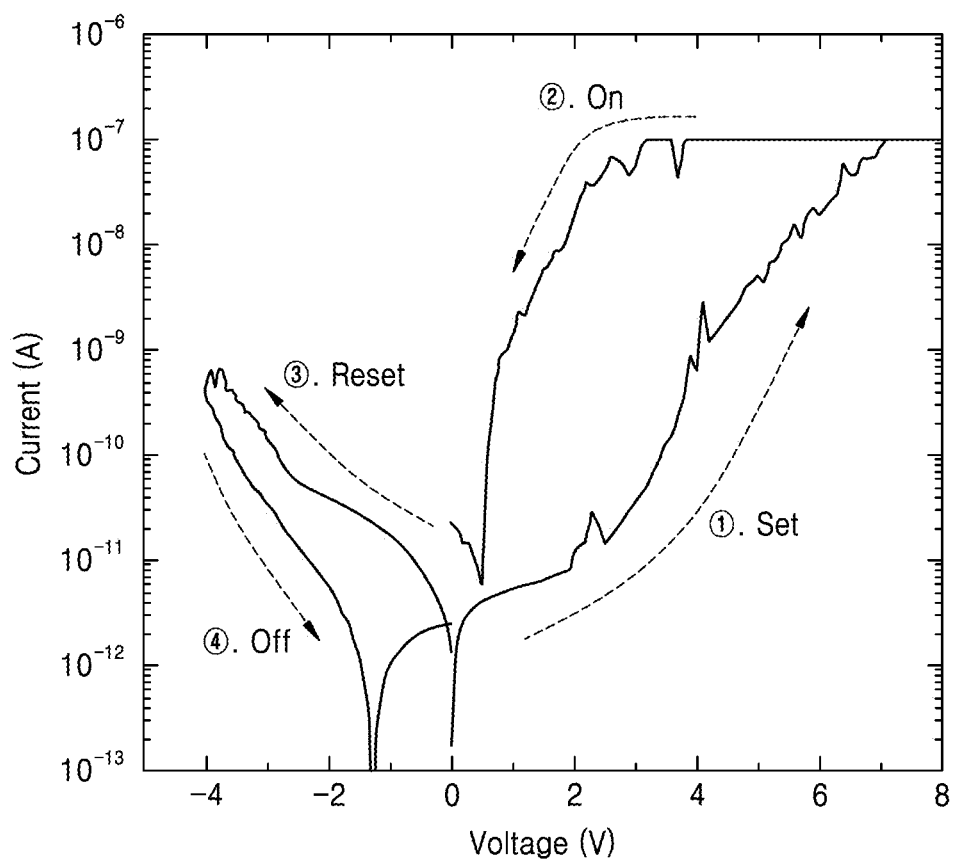
FIGS. 14 and 15 are example graphs illustrating resistance change characteristics of the structure illustrated in FIG. 11.
Figure 15:
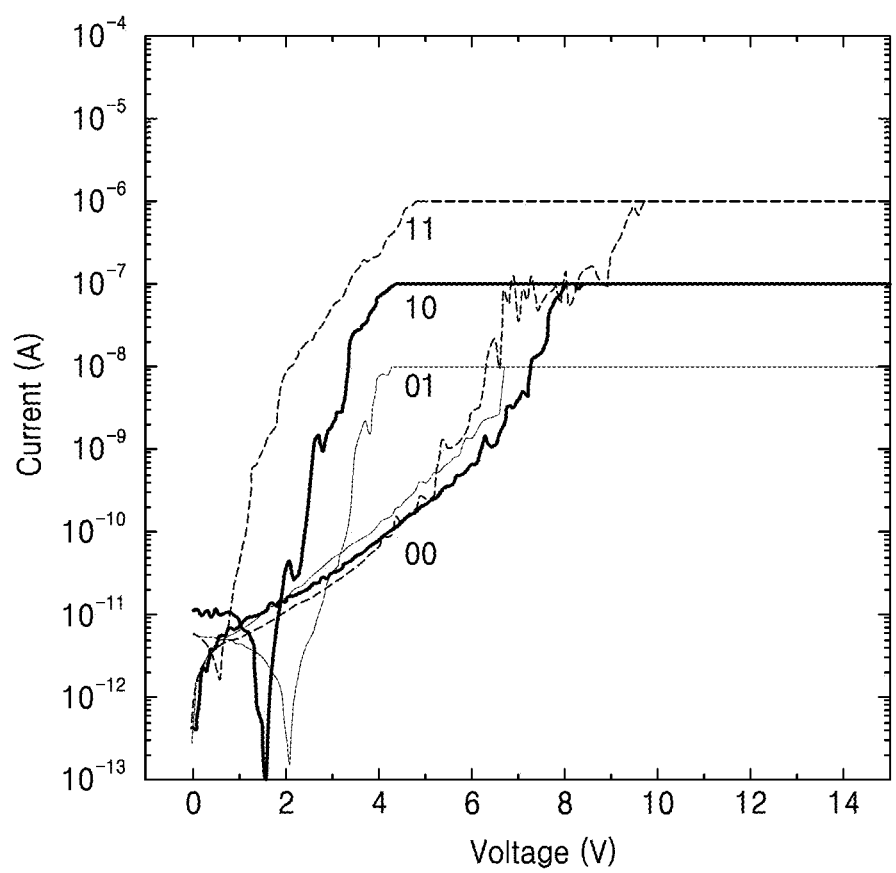

FIGS. 14 and 15 are example graphs illustrating resistance change characteristics of the structure illustrated in FIG. 11. First, referring to FIG. 14, it may be seen that a resistance change phenomenon (a set operation or a program operation) from a high resistance state to a low resistance state is induced at approximately +7 V, and a resistance change phenomenon (a reset operation or an erase operation) from a low resistance state to a high resistance state is induced at approximately −4 V. In addition, it may be seen that the resistance change phenomenon is induced in a region of approximately 100 nA or less, and thus, an operation may be performed with very low power consumption.

Referring to FIG. 15, the dielectric film 525 may have four different resistance states in the structure illustrated in FIG. 11. Accordingly, when the dielectric film 525 is used, one memory cell may process 2 bits of information. In the graphs illustrated in FIG. 14 and FIG. 15, the dielectric film 525 is formed of the same material, and resistance change characteristic of the dielectric film 525 may be changed only by controlling a current flowing through the dielectric film 525.

For example, in the program mode described above with reference to FIG. 7 and FIG. 8, a resistance of a channel of the unselected memory cell 720, that is, a resistance of the semiconductor layer 522b of the unselected memory cell 720 changes depending on a strength of the turn-on voltage applied to the gate 531b of the unselected memory cell 720. Accordingly, when the program voltage applied to the bit line BL connected to the selected memory cell 710 is fixed, a current flowing through the dielectric film 525a and the resistance change layer 523a of the selected memory cell 710 may change depending on the intensity of the turn-on voltage applied to the gate 531b of the unselected memory cell 720. In this way, resistance change characteristics and a resistance state of the dielectric film 525 may be selected by selecting a condition of the current flowing through the dielectric film 525 and the resistance change layer 523 under the control of the turn-on voltage applied to the gate 531b of the unselected memory cell 720.

Figure 16A:
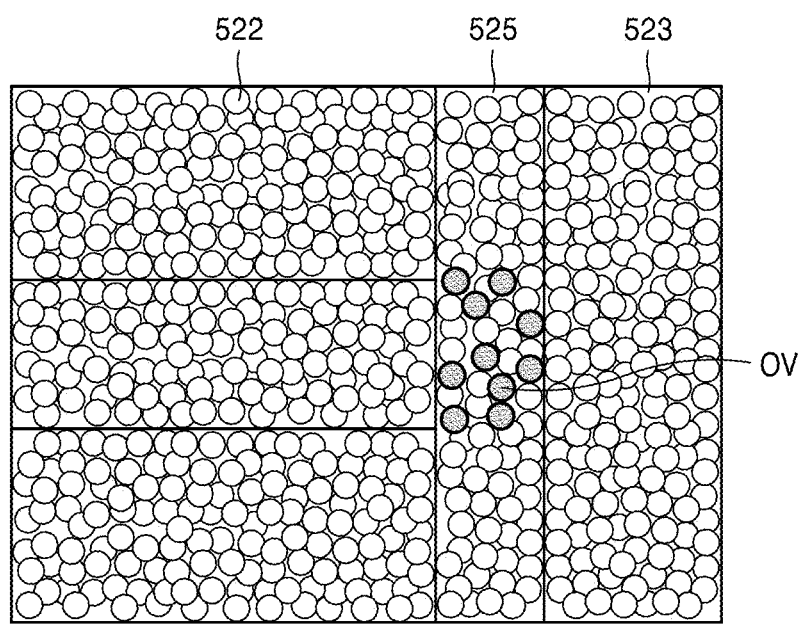
FIGS. 16A and 16B are conceptual example diagrams illustrating movement of oxygen vacancy according to a resistance change operation in a dielectric film of a memory cell.
Figure 16B:
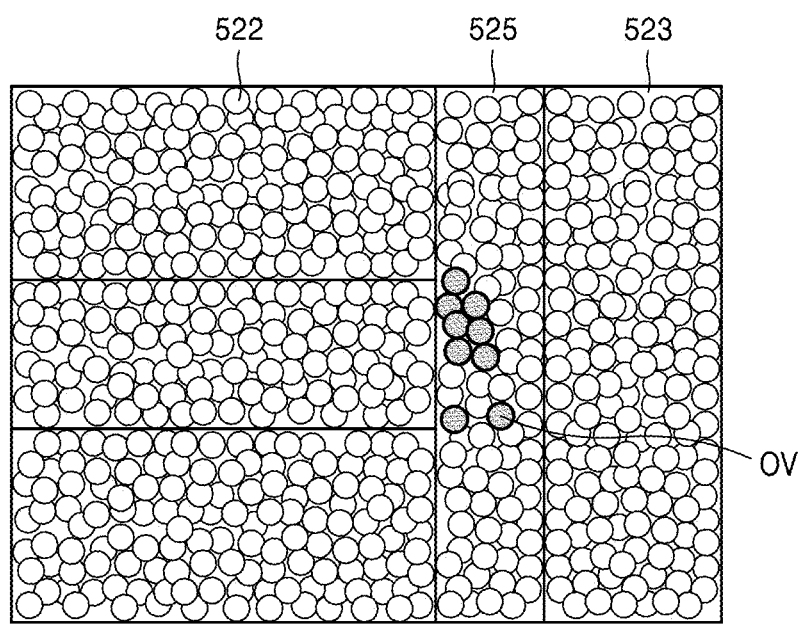

FIGS. 16A and 16B are conceptual example diagrams illustrating movement of oxygen vacancy according to a resistance change operation inside the dielectric film 525 of the memory cell. As illustrated in FIG. 16A, when a plurality of oxygen vacancies OV in the dielectric film 525 are evenly scattered inside the dielectric film 525, the dielectric film 525 is in a high resistance state. Moreover, as illustrated in FIG. 16B, when the plurality of oxygen vacancies OV in the dielectric film 525 are moved toward an interface with the semiconductor layer 522 and are intensively distributed at the interface with the semiconductor layer 522, the dielectric film 525 is in a low resistance state.

The change in resistance of the dielectric film 525 may be described as a phenomenon in which electrons are trapped and detrapped in traps formed by the oxygen vacancies (OV). For example, when the oxygen vacancies OV are evenly scattered inside the dielectric film 525, electrons are filled in traps spaced apart from each other at regular distances, and thus, it is difficult for a current to flow through the dielectric film 525. Accordingly, the dielectric film 525 is in a high resistance state. Moreover, when the oxygen vacancies OV in the dielectric film 525 are intensively distributed at the interface with the semiconductor layer 522, electrons are filled at the interface between the dielectric film 525 having a high density of oxygen vacancies OV and the semiconductor layer 522, and thus, a conductive filament is formed. Accordingly, the dielectric film 525 is in a low resistance state.

Accordingly, if the oxygen vacancies OV distributed in the dielectric film 525 are moved to the interface between the dielectric film 525 and the semiconductor layer 522 according to a program operation, the dielectric film 525 may enter a low resistance state. In contrast to this, if the oxygen vacancies (OV) collected at the interface between the dielectric film 525 and the semiconductor layer 522 are evenly scattered inside the dielectric film 525 to move away from the interface between the dielectric film 525 and the semiconductor layer 522 according to an erase operation, the dielectric film 525 may return to a high resistance state.

To this end, a positive program voltage may be applied to a selected memory cell in a memory cell string through a bit line. At this time, in a partial region of the dielectric film 525 corresponding to the selected memory cell, the oxygen vacancies OV move toward the interface between the semiconductor layer 522 and the dielectric film 525. Then, if a density of the oxygen vacancies OV increases at the interface between the semiconductor layer 522 and the dielectric film 525, a resistance of the partial region of the dielectric film 525 corresponding to the selected memory cell is reduced. In addition, a negative (−) erase voltage may be applied to a selected memory cell in a memory cell string through a bit line. At this time, the oxygen vacancies OV move in a direction away from the interface between the semiconductor layer 522 and the dielectric film 525 in the partial region of the dielectric film 525 corresponding to the selected memory cell, and thus, a density of the oxygen vacancies OV at the interface between the semiconductor layer 522 and the dielectric film 525 is reduced. Then, the resistance of the partial region of the dielectric film 525 corresponding to the selected memory cell increases.

Figure 17:
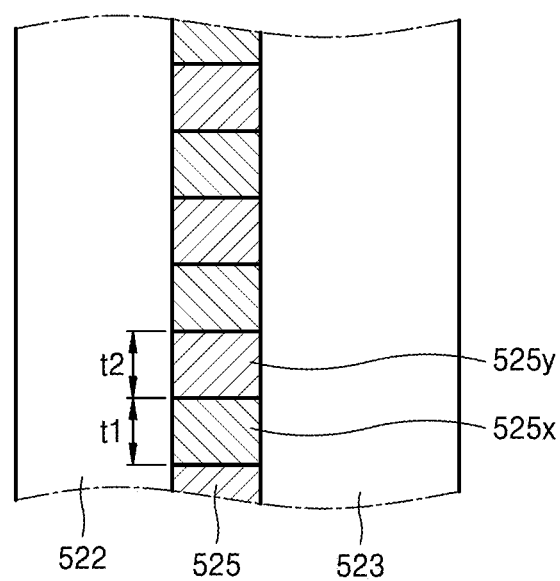
FIG. 17 is a cross-sectional view schematically illustrating a structure of a dielectric film in a memory cell, according to an embodiment.

FIG. 17 is a cross-sectional view schematically illustrating a structure of the dielectric film 525 in a memory cell according to an embodiment. Referring to FIG. 17, the dielectric film 525 may include a plurality of first layers 525x formed of a material of the semiconductor layer 522 and a plurality of second layers 525y formed of a transition metal oxide. In other words, the second layer 525y may be formed of a material of the resistance change layer 523. The plurality of first layers 525x and the plurality of second layers 525y may be alternately stacked in the vertical direction. Then, the dielectric film 525 may function on average as a mixture layer in which a material of the semiconductor layer 522 and a material of the resistance change layer 523 are mixed.

The plurality of first layers 525x and the plurality of second layers 525y may be formed by, for example, an atomic layer deposition method or a chemical vapor deposition method. Particularly, when the atomic layer deposition method is used, the first layer 525x and the second layer 525y may be repeatedly formed very thinly for each atomic layer, and thus, the material of the semiconductor layer 522 and the material of the resistance change layer 523 may be mixed very uniformly in the dielectric film 525. For example, a thickness t1 of each of the first layers 525x and a thickness t2 of each of the second layers 525y may be selected in a range from approximately 0.1 nm to approximately 1 nm.

A ratio of the material of the semiconductor layer 522 to the material of the resistance change layer 523 in the dielectric film 525 may be determined by a ratio of the thickness t1 of each of the first layers 525x to the thickness t2 of each of the second layers 525y. For example, a ratio of the thickness of each of the first layers 525x to the sum (t1+t2) of the thicknesses of each of the first layers 525x and each of the second layers 525y may be about 20% to about 80%. Alternatively, ratio of the thickness t1 of each of the first layers 525x to the sum (t1+t2) of the thicknesses of each of the first layers 525x and each of the second layers 525y may be about 40% to about 60%. The ratio of the thickness of each of the first layers 525x to the sum (t1+t2) of the thicknesses of each of the first layers 525x and each of the second layers 525y may be maintained constant within a deviation range of about 10% in the entire region of the dielectric film 525. Then, a proportion of the material of the semiconductor layer 522 in the dielectric film 525 may be maintained constant within a deviation range of about 10% in the entire region of the dielectric film 525.

A configuration of the dielectric film 525 illustrated in FIG. 17 is merely an example and is not limited thereto. For example, it is also possible to form the dielectric film 525 by depositing a mixture of the material of the semiconductor layer 522 and the material of the resistance change layer 523 by using a chemical vapor deposition method.

Figure 18:
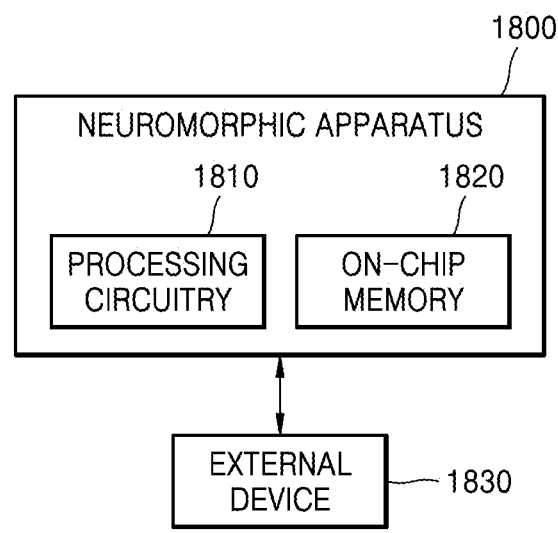
FIG. 18 is a diagram illustrating a neuromorphic apparatus and an external device connected thereto.

FIG. 18 is a diagram illustrating a neuromorphic apparatus and an external device connected thereto.

Referring to FIG. 18 a neuromorphic apparatus 1800 may include processing circuitry 1810 and/or memory 1820. The neuromorphic apparatus 1800 may include a memory based on the embodiments in FIGS. 1-7 of the present application.

In some example embodiments, processing circuitry 1810 may be configured to control functions for driving the neuromorphic apparatus 1800. For example, the processing circuitry 1810 may be configured to control the neuromorphic apparatus 1800 by executing programs stored in the memory 1820 of the neuromorphic apparatus 1800. In some example embodiments, the processing circuitry may include hardware such as logic circuits; a hardware/software combination, such as a processor executing software; or a combination thereof. For example, a processor may include, but is not limited to, a central processing unit (CPU), a graphics processing unit (GPU), an application processor (AP) included in the neuromorphic apparatus 1800, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), or the like. In some example embodiments, the processing circuitry 1810 may be configured to read/write various data from/in the external device 1830 and/or execute the neuromorphic apparatus 1800 by using the read/written data. In some embodiments, the external device 1830 may include an external memory and/or sensor array with an image sensor (e.g., CMOS image sensor circuit).

In some embodiments, the neuromorphic apparatus in FIG. 18 may be applied in a machine learning system. The machine learning system may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A nonvolatile memory device comprising:
   a plurality of memory cell strings that each include,
      a semiconductor layer extending in a first direction and having a first surface opposite a second surface,
      a plurality of gates and a plurality of insulators extending in a second direction perpendicular to the first direction, the plurality of gates and the plurality of insulators being alternately arranged in the first direction,
      a gate insulating layer extending in the first direction between the plurality of gates and the first surface of the semiconductor layer and between the plurality of insulators and the first surface of the semiconductor layer, and
      a dielectric film extending in the first direction on the second surface of the semiconductor layer, the dielectric film having a plurality of movable oxygen vacancies distributed therein.

2. The nonvolatile memory device of claim 1, wherein the dielectric film includes a mixture of a material of the semiconductor layer and a transition metal oxide.

3. The nonvolatile memory device of claim 2, wherein the material of the semiconductor layer includes at least one of Si, Ge, indium gallium zinc oxide (IGZO), and GaAs.

4. The nonvolatile memory device of claim 2, wherein the transition metal oxide includes an oxide of at least one of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), and praseodymium (Pr).

5. The nonvolatile memory device of claim 2, wherein a proportion of the material of the semiconductor layer in the dielectric film is about 20 at. % to about 80 at. %.

6. The nonvolatile memory device of claim 5, wherein the proportion of the material of the semiconductor layer in the dielectric film is about 40 at. % to about 60 at. %.

7. The nonvolatile memory device of claim 5, wherein the proportion of the material of the semiconductor layer in the dielectric film is constant within a deviation range of about 10% in an entire region of the dielectric film.

8. The nonvolatile memory device of claim 1,
   wherein a width of the dielectric film in the second direction is about 1.5 nm to about 10 nm, and
   wherein the width of the dielectric film is constant within a deviation range of about 10% in an entire region of the dielectric film.

9. The nonvolatile memory device of claim 1, wherein the dielectric film includes a plurality of first layers and plurality of second layers, the plurality of first layers are formed of a material of the semiconductor layer, the plurality of second layers are formed of a transition metal oxide, and the plurality of first layers and the plurality of second layers are alternately arranged in the first direction.

10. The nonvolatile memory device of claim 9, wherein the plurality of first layers and the plurality of second layers are formed by an atomic layer deposition method or a chemical vapor deposition method.

11. The nonvolatile memory device of claim 9, wherein
a thickness of each of the plurality of first layers and a thickness of each of the plurality of second layers are about 0.1 nm to about 1 nm, and
a ratio of the thickness of each of the plurality of first layers to a sum of thicknesses of each of the plurality of first layers and each of the plurality of second layers is constant within a deviation range of about 10% in an entire region of the dielectric film.

12. The nonvolatile memory device of claim 11, wherein the ratio of the thickness of each of the plurality of first layers to a sum of the thicknesses of each of the plurality of first layers and each of the plurality of second layers is about 20% to about 80%.

13. The nonvolatile memory device of claim 12, wherein the ratio of the thickness of each of the plurality of first layers to the sum of the thicknesses of each of the plurality of first layers and each of the plurality of second layers is about 40% to about 60%.

14. The nonvolatile memory device of claim 1, wherein
each of the plurality of memory cell strings further includes a resistance change layer,
the resistance change layer faces the second surface of the semiconductor layer,
the resistance change layer extends in the first direction, and
the dielectric film is between the second surface of the semiconductor layer and the resistance change layer.

15. The nonvolatile memory device of claim 14, wherein the dielectric film includes a mixture of a material of the semiconductor layer and a material of the resistance change layer.

16. The nonvolatile memory device of claim 15, wherein
each corresponding memory cell string of the plurality of memory cell strings includes a plurality of memory cells arranged in a vertical stacked structure of the corresponding memory cell string, and
each corresponding memory cell of the plurality of memory cells in the corresponding memory cell string is defined by,
a corresponding gate among the plurality of gates in the corresponding memory cell, a part of the semiconductor layer of the corresponding memory cell string adjacent to the corresponding gate in the second direction,
a part of the gate insulating layer of the corresponding memory cell string adjacent to the corresponding gate in the second direction,
a part of the dielectric film of the corresponding memory cell string adjacent to the corresponding gate in the second direction, and
a part of the resistance change layer of the corresponding memory cell string adjacent to the corresponding gate in the second direction.

17. The nonvolatile memory device of claim 16, further comprising:

a control logic configured to control voltages applied to at least one of the plurality of memory cell strings such that, during a read mode,
the control logic is configured to apply a first voltage to an unselected memory cell for causing a current to flow only through the semiconductor layer of the unselected memory cell, and
the control logic being configured to apply a second voltage to a selected memory cell for causing a current to flow through all of the semiconductor layer, the dielectric film, and the resistance change layer of the selected memory cell; and
a bit line configured to apply a read voltage to the selected memory cell, wherein
the unselected memory cell and the selected memory cell are among the plurality of memory cells in the plurality of memory cell strings, and
the selected memory cell is in a selected memory cell string among the plurality of memory cell strings.

18. The nonvolatile memory device of claim 17, wherein an absolute value of the second voltage is less than an absolute value of the first voltage.

19. The nonvolatile memory device of claim 17, wherein
the second voltage has a value that causes a resistance of the semiconductor layer of the selected memory cell to be greater than or equal to a minimum resistance of a combined resistance of a resistance of the dielectric film and a resistance of the resistance change layer of the selected memory cell.

20. The nonvolatile memory device of claim 17, wherein the second voltage has a value that causes a resistance of the semiconductor layer of the selected memory cell to be less than or equal to a maximum resistance of a combined resistance of a resistance of the dielectric film and a resistance of the resistance change layer of the selected memory cell.

21. The nonvolatile memory device of claim 17, wherein
an absolute value of the second voltage is greater than an absolute value of a third voltage, and
the control logic is configured to apply the third voltage to the selected memory cell for causing a current to flow through only the dielectric film and the resistance change layer of the selected memory cell in the selected memory cell string.

22. The nonvolatile memory device of claim 21, wherein
the control logic is configured to control voltages applied to at least one of the plurality of memory cell strings in a program mode,
the control logic is configured to apply the first voltage to the unselected memory cell and the third voltage to the selected memory cell during the program mode, and
the bit line is configured to apply a positive program voltage to the selected memory cell during the program mode.

23. The nonvolatile memory device of claim 22, wherein the dielectric film is configured such that, in response to the positive program voltage being applied to the selected memory cell through the bit line, the oxygen vacancies move toward an interface between the semiconductor layer of the selected memory cell string and the dielectric film of the selected memory cell string in a partial region of the dielectric film of the selected memory cell string corresponding to the selected memory cell, a density of the oxygen vacancies increases at the interface between the semiconductor layer of the selected memory cell string and the dielectric film of the selected memory cell string, and a resistance of the partial region of the dielectric film of the selected memory cell string is reduced.

24. The nonvolatile memory device of claim 23, wherein the dielectric film is configured to have at least four different resistance states.

25. The nonvolatile memory device of claim 24, wherein the dielectric film is configured to change a resistance state thereof based on a phenomenon in which electrons are trapped and detrapped in traps formed by the oxygen vacancies.

26. The nonvolatile memory device of claim 21, wherein
the control logic is configured to control voltages applied to at least one of plurality of memory cell strings in an erase mode,
the control logic is configured to apply the first voltage to the unselected memory cell and the third voltage to the selected memory cell during the erase mode, and
the bit line is configured to apply a negative erase voltage to the selected memory cell during the erase mode.

27. The nonvolatile memory device of claim 26, wherein,
the dielectric film is configured such that, in response to the negative erase voltage being applied to the selected memory cell through the bit line, the oxygen vacancies move in a direction away from an interface between the semiconductor layer of the selected memory cell string and the dielectric film of the selected memory cell string in a partial region of the dielectric film of the selected memory cell string corresponding to the selected memory cell, a density of the oxygen vacancies is reduced at the interface between the semiconductor layer of the selected memory cell string and the dielectric film of the selected memory cell string, and a resistance of the partial region of the dielectric film of the selected memory cell string increases.

28. A nonvolatile memory device comprising:
a substrate;
a plurality of gates and a plurality of insulators alternately stacked on each other on the substrate;
a plurality of bit lines extending in a first direction crossing the plurality of gates extending in a second direction; and
a plurality of memory cell strings spaced apart from each other on the substrate and extending vertically through the plurality of gates and the plurality of insulators,
each of the plurality of memory cell strings connected to a corresponding bit line among the plurality of bit lines,
each of the plurality of memory cell strings including a resistance change layer, a dielectric film surrounding the resistance change layer, a semiconductor layer surrounding the dielectric film, and a gate insulating layer surrounding the semiconductor layer,
each of the plurality of memory cell strings including a plurality of memory cells stacked on top of each other,
each memory cell among the plurality of memory cells being defined by a corresponding gate, among the plurality of gates, connected respectively to a corresponding portion of the resistance change layer, a corresponding portion of the dielectric film, a corresponding portion of the semiconductor layer, and a corresponding portion of the gate insulating layer at a same height in a same one of the plurality of memory cell strings, and
each memory cell being configured to have movable oxygen vacancies inside the corresponding portion of the dielectric film in response to voltages applied to the corresponding gate and the corresponding bit line connected to the memory cell.

29. The nonvolatile memory device of claim 28, further comprising:
a control logic coupled to the plurality of gates,
the control logic being configured to read a selected memory cell by applying a first voltage to an unselected memory cell and a second voltage to the selected memory cell using two of the plurality of gates while a read voltage is applied to a selected memory cell string using the corresponding bit line connected to the selected memory cell string,
the selected memory cell string including the selected memory cell and the unselected memory cell among the plurality of memory cells in the selected memory cell string,
the first voltage causing a current to flow only through the corresponding portion of the semiconductor layer of the unselected memory cell, and
the second voltage causing a current to flow through the corresponding portion of the semiconductor layer, the corresponding portion of the dielectric film, and the corresponding portion of the resistance change layer of the selected memory cell.

30. The nonvolatile memory device of claim 28, further comprising:
a control logic coupled to the plurality of gates,
the control logic being configured to program a selected memory cell by applying a first voltage to an unselected memory cell and a turn-off voltage to the selected memory cell using two of the plurality of gates while a positive program voltage is applied to a selected memory cell string using the corresponding bit line connected to the selected memory cell string,
the selected memory cell string including the selected memory cell and the unselected memory cell among the plurality of memory cells in the selected memory cell string,
the first voltage causing a current to flow only through the corresponding portion of the semiconductor layer of the unselected memory cell, and
the turn-off voltage causing a current to flow through the corresponding portion of the dielectric film and the corresponding portion of the resistance change layer of the selected memory cell.

31. The nonvolatile memory device of claim 28, further comprising:
a control logic coupled to the plurality of gates,
the control logic being configured to erase a selected memory cell by applying a first voltage to an unselected memory cell and a turn-off voltage to the selected memory cell using two of the plurality of gates while a negative erase voltage is applied to a selected memory cell string using the corresponding bit line connected to the selected memory cell string,
the selected memory cell string including the selected memory cell and the unselected memory cell among the plurality of memory cells in the selected memory cell string,
the first voltage causing a current to flow only through the corresponding portion of the semiconductor layer of the unselected memory cell, and the turn-off voltage causing a current to flow through the corresponding portion of the dielectric film and the corresponding portion of the resistance change layer of the selected memory cell.

32. The nonvolatile memory device of claim 28, wherein
the resistance change layer includes an oxide of at least one of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), and praseodymium (Pr),
the semiconductor layer includes silicon, germanium, indium gallium zinc oxide (IGZO), or GaAs,
the gate insulating layer includes silicon oxide, and
the dielectric film includes a mixture of a material of the semiconductor layer and a transition metal oxide.

* * * * *